United States Patent [19]

Katsutani

[11] Patent Number: 5,717,351
[45] Date of Patent: Feb. 10, 1998

[54] INTEGRATED CIRCUIT

[75] Inventor: Masafumi Katsutani, Nara, Japan

[73] Assignee: Sharp Kabushiki Kaisha, Osaka, Japan

[21] Appl. No.: 620,563

[22] Filed: Mar. 22, 1996

[30]  Foreign Application Priority Data

Mar. 24, 1995 [JP] Japan .................................. 7-066386
Dec. 20, 1995 [JP] Japan .................................. 7-332303

[51] Int. Cl.$^6$ .......................................... H03K 19/084
[52] U.S. Cl. ...................... 327/108; 327/299; 327/565;
377/54; 377/69
[58] Field of Search ........................... 377/54, 69, 78;
327/108, 299, 565

[56] References Cited

U.S. PATENT DOCUMENTS 4,771,279  9/1988  Hannah .................................. 377/54
5,510,748  4/1996  Erhart et al. ........................ 327/108
5,572,211  11/1996  Erhart et al. ........................ 341/144

FOREIGN PATENT DOCUMENTS 63-53558  10/1988  Japan .
3-233492  10/1991  Japan .

*Primary Examiner*—Margaret Rose Wambach

[57]  ABSTRACT

A start signal is given to an SP_I/O buffer through a terminal SP1, and its pulse width is controlled by an SP control circuit. A selection signal SEL is given to a selector circuit so that the data shift direction of a bidirectional shift register is switched. When the shift direction is directed to the other side, the start signal is supplied from a terminal SP2 through an SP_I/O buffer. When the shift operation is to be done from the terminal SP1 to the terminal SP2, the output of the 38th stage which precedes the final stage, namely, the 40th stage, by two stages is derived from the terminal SP2 as an input start signal for the succeeding driver, during a time period which is longer than one cycle of a clock signal CLK. According to this configuration, a cascade connection can be realized easily and surely even when a clock signal of a higher frequency is used.

31 Claims, 24 Drawing Sheets

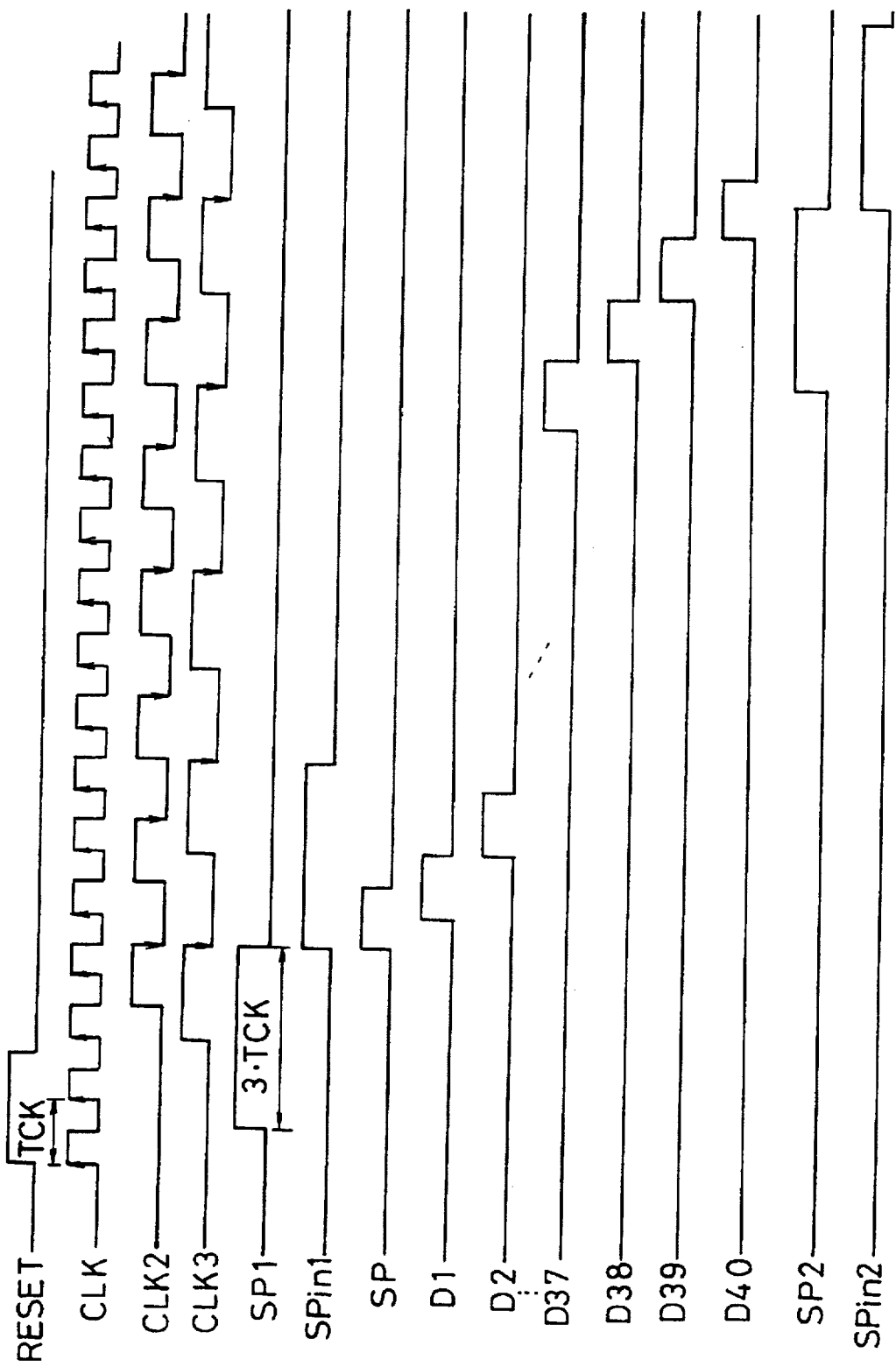

INTEGRATED CIRCUIT

BACKGROUND OF THE INVENTION

1. Field of the Invention

The invention relates to an integrated circuit. In particular it relates to an integrated circuit for driving a liquid crystal display device, in which a multistage shift register (which is difficult to realize in a single integrated circuit) can be realized by a cascade connection.

2. Description of the Related Art

Conventionally, as shown in FIGS. 23A and 23B, an integrated circuit such as that shown in FIG. 22 is used for driving a liquid crystal display device. Such an integrated circuit starts operating in response to a start pulse (hereinafter, often abbreviated as "SP") and derives an output while sequentially shifting in accordance with a clock signal (hereinafter, often abbreviated as "CLK"). The shift operation is bidirectional and its direction is switched in accordance with a selection signal (hereinafter, often abbreviated as "SEL").

A start pulse for one operation direction is inputted through a terminal SP1 and then supplied to an SP control circuit 2 via an SP input/output (hereinafter, often abbreviated as "SP_I/O") buffer 1. When the selection signal SEL has one logic level, the SP_I/O buffer 1 is activated by a selector circuit 3. When the SP_I/O buffer 1 is activated, a multistage bidirectional shift register 4, for example, of 40 stages derives outputs of the stages while shifting in the direction of 1, 2, . . . , 40 in synchronization with the clock signal CLK. When the selection signal SEL has another logic level, the operation direction of the bidirectional shift register 4 is reversed, an SP_I/O buffer 5 to which the start pulse is supplied through another terminal SP2 is activated, and the SP_I/O buffer 1 halts the operation. As a result, in the bidirectional shift register 4, a stage from which an output is derived is sequentially shifted in the direction of 40, 39, . . . , 2, 1.

The SP_I/O buffers 1 and 5, the SP control circuit 2, the selector circuit 3, and the bidirectional shift register 4 are used as drivers 6 such as shown in FIGS. 23A and 23B, for driving an LCD panel 7 or 8. In the LCD panels 7, 8, a number of signal lines are arranged in the row and column directions, and an image is displayed by the matrix driving. For example, the drivers 6 operate in the following manner: Image data for one line which are serially input are held while being sequentially subjected to shift processing, and all the data for one line are output to the LCD panel 7 or 8 in parallel.

The drivers 6 are disposed on the upper and lower sides of the LCD panel 7 in FIG. 23A. The upper and lower drivers 6 hold data for one line of an odd-numbered column and data for one line of an even-numbered column, respectively. In FIG. 23B, the LCD panel 8 is divided into two areas, and column lines of the upper and lower areas are driven by the drivers 6, respectively. In these cases, if the drivers 6 of the same kind are mounted on the upper and lower sides, owing to the terminal arrangement of the packages for an integrated circuit, it is necessary to provide the drivers with a function of enabling the shift direction of image data to be switched in accordance with the selection signal SEL. Although the bidirectional shift register 4 may have 40 or more stages, the stage number is restricted by the size of an integrated circuit package or a semiconductor chip, and the like. When the LCD panels 7, 8 are of high definition or capable of color display, it is required to cascade-connect a plurality of integrated circuits so as to increase the number of shifting stages.

FIG. 24 shows the internal configuration of the SP control circuit 2 and the bidirectional shift register 4 shown in FIG. 22. The SP control circuit 2 comprises a D-flip flop (hereinafter, abbreviated as "D_F/F") 100. The bidirectional shift register 4 comprises D_F/Fs 101 to 140 which are cascade-connected so that the register has 40 stages as a whole. In the register, the output Q of the preceding stage is connected to the input D of the next stage and the clock signal CK is commonly connected to the stages. When the start pulse is input on the terminal SP1 side and the direction of deriving the output from the final stage, the D_F/F 140 is selected on the terminal SP2 side, the pulse width is adjusted by the D_F/F 100 of the SP control circuit 2. The outputs of the D_F/Fs 101 to 140 of the bidirectional shift register 4 are sequentially shifted in synchronization with the clock signal CLK.

FIG. 25 shows the operation of the configuration of FIG. 24. Each of the D_F/Fs 100 to 140 stores the data input D in synchronization with a fall of the clock signal CLK and derives it as the output Q. When a signal is supplied as the start pulse to the terminal SP1, the output SP01 of the D_F/F 100 rises at the first fall of the clock signal and falls at the next fall of the clock signal. The operation of a D_F/F is slightly delayed from the instant of fall of the clock signal. At the instant when the clock signal falls, therefore, the data input of the first stage of the bidirectional shift register 4, i.e., of the D_F/F 101 is high. The data input is low at the next fall of the clock signal. In this way, the outputs D1 to D40 of the stages or the D_F/Fs 101 to 140 constituting the bidirectional shift register 4 are changed while being sequentially shifted by one clock cycle. In the case of a cascade connection, the output D40 of the D_F/F 140 of the final stage is derived from the terminal SP2 as the start signal for the succeeding driver 6.

When the drivers 6 are cascade-connected, the wiring from the terminal SP2 to the input terminal SP1 of the succeeding driver 6 is necessary, and hence the input capacitance of the. succeeding driver and the stray capacitance are added. In the succeeding driver 6, therefore, the waveform is rounded so as to be easily deformed as indicated by hatching in FIG. 25. At the point of time when the input exceeds a threshold Vth, the succeeding driver 6 judges that the level of the input is high. Consequently, the input is required to become high before the clock signal CLK rises, as indicated as SP02. When the conditions are satisfied, data D1next are sequentially shifted also in the succeeding driver 6 so that the whole configuration operates as one shift register.

The prior art in which a plurality of integrated circuits are cascade-connected so as to operate as one shift register is disclosed, for example, in Japanese Examined Patent Publication JP-B2 63-53558 (1988), and Japanese Unexamined Patent Publication JP-A 3-233492 (1991). In the prior art disclosed in Japanese Examined Patent Publication JP-B2 63-53558, addresses of memory cells are sequentially designated by an address counter, and the operation of the succeeding driver is started by using a carry signal indicative of the carry of the counter. In the prior art disclosed in Japanese Unexamined Patent Publication JP-A 3-233492, an output faster by a predetermined clock pulse number in accordance with the frequency division number of a clock signal is derived from a stage preceding the final stage.

In the prior art described with reference to FIGS. 22 to 25, when the drivers and the like are cascade-connected, a phenomenon takes place in which the waveform of the output pulse from a preceding stage is rounded as indicated by the hatched portion in FIG. 25. As the frequency of the clock signal CLK is higher, the time period required for the start pulse to reach a level higher than the threshold Vth becomes shorter so that the possibility of failing to capture the start signal at a rise of the clock signal CLK is increased. If the capturing of the start signal in the succeeding driver is delayed, it is impossible to cause the whole configuration to operate as one shift register, with the result that the image cannot be displayed normally. When the driving of the LCD panel 7 such as that shown in FIG. 23A involves independent driving of the three primary colors R, G, and B in a color image display, particularly, there occurs color distortion, so that the image quality is further impaired.

In the prior art disclosed in Japanese Examined Patent Publication JP-B2 63-53558 or Japanese Unexamined Patent Publication JP-A 3-233492, the timing of the output pulse is controlled by using the counter circuit. However, the increased number of elements increases the power consumption and the size of the semiconductor chip for forming the integrated circuit are increased so that the production cost is increased.

In such prior art, when a plurality of devices 9 which are integrated circuits are cascade-connected as shown in FIG. 26, a latch pulse (LP) or a start pulse (SP) must be supplied in parallel to the devices 9 in order to initialize the frequency division state of a clock signal which is used in the second and succeeding devices 9. To comply with this, each device 9 requires three terminals for cascade connection, i.e., an input terminal, an output terminal, and an input terminal for the latch pulse. Each device 9 has many output terminals and also requires a clock input terminal. Therefore, it is difficult to further dispose the input terminal for the latch pulse. Moreover, the wiring for supplying the latch pulse causes the design, working, and operation of a printed circuit board or the like to be difficult to do achieve.

SUMMARY OF THE INVENTION

It is an object of the invention to provide an integrated circuit capable of being easily cascade-connected and realizing a high-speed operation, a low power consumption, and a low production cost.

The invention provides an integrated circuit including a multistage shift register, from each stage of which an output sequentially shifted in synchronization with a clock signal is derived in response to an input start signal, the integrated circuit comprising:

a start signal generating circuit for generating an output start signal in a cycle longer than one cycle of the clock signal in response to an output from a stage preceding a final stage of the multistage shift register, wherein a cascade connection between the integrated circuit and a succeeding integrated circuit is enabled by using the output start signal as an input start signal for the succeeding integrated circuit.

According to the invention, the start signal generating circuit generates an output start signal which serves as an input start signal for the succeeding integrated circuit in the case of cascade connection, in response to an output from a stage preceding the final stage of the multistage shift register, in a cycle longer than one cycle of the clock signal. Since the output start signal is taken out from a stage preceding the final stage, the output start signal can be derived at earlier timing than timing when an output from the final stage is derived. Even when the output waveform is rounded so as to be longer than one cycle of the clock signal as a result of a higher frequency of the clock signal, the rising conditions necessary in an input start signal for a succeeding integrated circuit can still be satisfied.

The invention is further characterized in that a plurality of integrated circuits cascade-connected to each other can operate as one multistage shift register in accordance with a common clock signal as a whole.

According to the invention, the cascade-connected integrated circuits operate as a whole as one multistage shift register in accordance with the common clock signal. Even when the size of a semiconductor chip for forming an integrated circuit or the number of terminals of a package is restricted, it is still possible to easily realize a shift register of a large number of stages by using a plurality of the integrated circuits.

In the invention, the start signal generating circuit comprises a D-flip flop to which the output of a stage, preceding by two stages the final stage of the multistage shift register, is supplied as a data input and a signal obtained by dividing a frequency of the clock signal by two is supplied as a clock input, and which generates the output start signal as an output.

According to the invention, the output of the stage preceding the final stage by two stages is the data input of the D-flip flop, and the output start signal is derived as a signal which is high during a time period corresponding to two cycles of the clock signal. The output start signal can be generated by this simple configuration. Consequently, the operation properties of cascade-connected integrated circuits can be improved without increasing the size of a semiconductor chip and the power consumption.

In the invention, the start signal generating circuit comprises:

an n frequency division circuit which outputs a signal obtained by dividing a frequency of the clock signal by n (n being an integer not less than 3); and a D-flip flop to which an output of a stage preceding by n stages the final stage of the multistage shift register is supplied as a data input and an output of the n frequency division circuit is supplied as a clock input, and which generates the output start signal as an output.

According to the invention, the n frequency division circuit (n is an integer not less than 3) receives the clock signal and outputs a signal obtained by dividing the frequency of the clock signal by n. The D-flip flop receives as a data input an output of the stage preceding by n stages the final stage of the multistage shift register and as a clock signal the signal obtained by dividing the frequency of the clock signal by n, and outputs the output start signal. In other words, it is possible to output the output start signal which is high during a time period corresponding to n times the cycle of the clock signal, in accordance with the output from the stage preceding by n stages. The output start signal can be generated by this simple configuration. Consequently, the operation properties of a cascade-connected integrated circuit can be improved without increasing the size of a semiconductor chip and the power consumption. Since the start signal of a sufficiently long pulse width can be generated, it is possible to easily cause the multistage shift register in the succeeding driver to normally operate.

The invention is still further characterized in that a start pulse control circuit is provided which receives the input start signal and controls the input start signal so as to have a pulse width suitable for the operation of the multistage shift register.

According to the invention, the input start signal is controlled so as to have a pulse width suitable for the operation of the multistage shift register, by the start pulse control circuit. In the input start signal, the pulse width is not required to be accurately set but is allowed to be sufficiently long. Therefore, the operation can be easily conducted in an accurate manner.

The invention is yet further characterized in that the multistage shift register can be switched bidirectionally in shift direction.

According to the invention, since the multistage shift register can be switched bidirectionally in shift direction, the direction of the package of the integrated circuit can be suitably selected so that mounting and wiring are conducted efficiently.

The invention is even further characterized in that a liquid crystal display device is driven by outputs from a plurality of the stages of the multistage shift register.

According to the invention, since a liquid crystal display device is driven by outputs from the stages of the multistage shift register which is bidirectional, for example, integrated circuits of the same kind can be mounted so as to be disposed on the both sides of the liquid crystal display device and directed to different directions, thereby facilitating connection wiring.

The invention is still even further characterized in that the integrated circuit further comprises a frequency division circuit for dividing a frequency of the clock signal and thereby generating a signal of a cycle longer than that of the clock signal; and an initializing circuit for initializing the frequency division circuit, when power is turned on.

According to the invention, a signal of a cycle longer than that of the clock signal used in the start signal generating circuit is generated by the frequency division circuit which divides the frequency of the clock signal. The integrated circuit further comprises an initializing circuit for initializing the frequency division circuit, when the power is turned on. Since the initialization is conducted when the power is turned on, even when a plurality of the integrated circuits are cascade-connected, the frequency division circuits can be simultaneously initialized when the power is turned on, without connecting the initialization terminals to each other. Consequently, the start signal generating circuits in the cascade-connected integrated circuits can surely operate in a synchronized manner.

The invention is still further characterized in that, when power is turned on, the clock signal is halted during at least a predetermined time period, and wherein the initializing circuit comprises an internal oscillating circuit which oscillates in a cycle shorter than the predetermined time period during which the clock signal is halted and initializes the frequency division circuit in synchronization with an output of the internal oscillating circuit.

According to the invention, when the power is turned on, the clock signal is halted during at least a predetermined time period. The initializing circuit comprises the internal oscillating circuit which oscillates in a cycle shorter than the halting time period of the clock signal, and initializes the frequency division circuit in synchronization with the output of the internal oscillating circuit. The disposition of the internal oscillating Circuit enables the sequence operation of the initializing Circuit to be realized, thereby enabling initialization to be surely conducted.

The invention is yet even further characterized in that the initializing circuit initializes the frequency division circuit through a power-on reset operation uses a delay in a rising of a capacitor charging voltage.

According to the invention, the initialization of the frequency division circuit is realized by the power-on reset operation which uses a delay in a rising of the capacitor charging voltage. Before the power is turned on, no charge is accumulated in the capacitor. After the power is turned on, charges are accumulated and the terminal voltage is gradually increased. It is possible to surely conduct the initialization by using the rising properties of the capacitor.

As described above, according to the invention, the output start signal of the preceding stage which is used as the input start signal of the plurality of cascade-connected integrated circuits is generated by the start signal generating circuit in a cycle longer than one cycle of the clock signal, in response to an output from a stage preceding the final stage of the multistage shift register. Even when the waveform of the output start signal is rounded by the input capacitance of the succeeding integrated circuit, the stray capacitance of the wiring, and the like, this configuration allows the start signal to be surely synchronized with the clock signal of a higher frequency.

According to the invention, the plurality of integrated circuits which are cascade-connected can operate as a whole as a single shift register in accordance with the common clock signal. Even when the area of the integrated circuit is restricted by the size of a semiconductor chip or the number of output terminals of a package is restricted, a shift register which has a large number of stages as a whole can still be easily realized by using a plurality of integrated circuits.

According to the invention, the output start signal can be generated by the simple configuration using the D-flip flop, whereby the size of a semiconductor chip and the power consumption are prevented from being increased.

According to the invention, the output start signal can be generated by the simple configuration using the D-flip flop and the n frequency division circuit (n is an integer not less than 3). Furthermore, in accordance with the output of the stage preceding by n stages the final stage of the multistage shift register, it is possible to output the output start signal which is high during a time period corresponding to n times the cycle of the clock signal. Since the output start signal can be generated by this simple configuration, the operation properties in a connection can be improved without causing the size of a semiconductor chip and the power consumption to be increased. Since the start signal of a sufficiently long pulse width can be generated and then output with a sufficient temporal margin, it is possible to easily cause the multistage shift register in the succeeding driver to operate normally.

According to the invention, the input start signal is controlled by the start pulse control circuit which controls the signal so as to have a pulse width suitable for the operation of the multistage shift register. Consequently, the operation is enabled to surely operate by supplying the input start signal of a pulse width which is sufficiently longer than the cycle of the clock signal.

According to the invention, since the shift direction of the multistage shift register can be switched or the register is bidirectional, the wiring pattern for mounting the integrated circuit can be easily set and the area of a printed circuit board or the like can be reduced.

According to the invention, a liquid crystal display device is driven by outputs from the stages of the multistage shift register. Since the multistage shift register is bidirectional, integrated circuits of the same kind can be mounted so as to be disposed on the both sides of the liquid crystal display device, whereby an electrical connection can be realized with a rationalized wiring pattern.

According to the invention, a signal of a cycle which is longer than a cycle of the clock signal used in the start signal generating circuit is generated by the frequency division circuit which divides the frequency of the clock signal. The integrated further comprises the initializing circuit which, when the power is turned on, initializes the frequency division circuit. In each of integrated circuits which are cascade-connected, therefore, the frequency division circuit can operate surely in synchronization with the power-on operation.

According to the invention, the initializing circuit comprises the internal oscillating circuit. In the case where the clock signal is halted during at least a predetermined time period when the power is turned on, the frequency division circuit is initialized in synchronization with the output of the internal oscillating circuit. Since initialization is conducted in synchronization with the output of the internal oscillating circuit, the frequency division circuit of each integrated circuit can be surely initialized when the power is turned on.

According to the invention, the initializing circuit initializes the frequency division circuit by means of a power-on reset operation which uses a delay of of rising of a capacitor charging voltage. The power-on reset operation is allowed to be surely conducted by forming a capacitor in the integrated circuit. Consequently, the initialization can be done by a simple configuration.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other and further objects, features, and advantages of the invention will be more explicit from the following detailed description taken with reference to the drawings wherein:

FIG. 17 is a time chart showing the operation of the configuration of FIG. 16;

FIG. 18 is a time chart showing the operation of the configuration in which an output of a stage preceding by n stages (n bring an integer not less than 3) the final stage of a bidirectional shift register 14;

DESCRIPTION OF THE PREFERRED EMBODIMENTS

Figure 1:
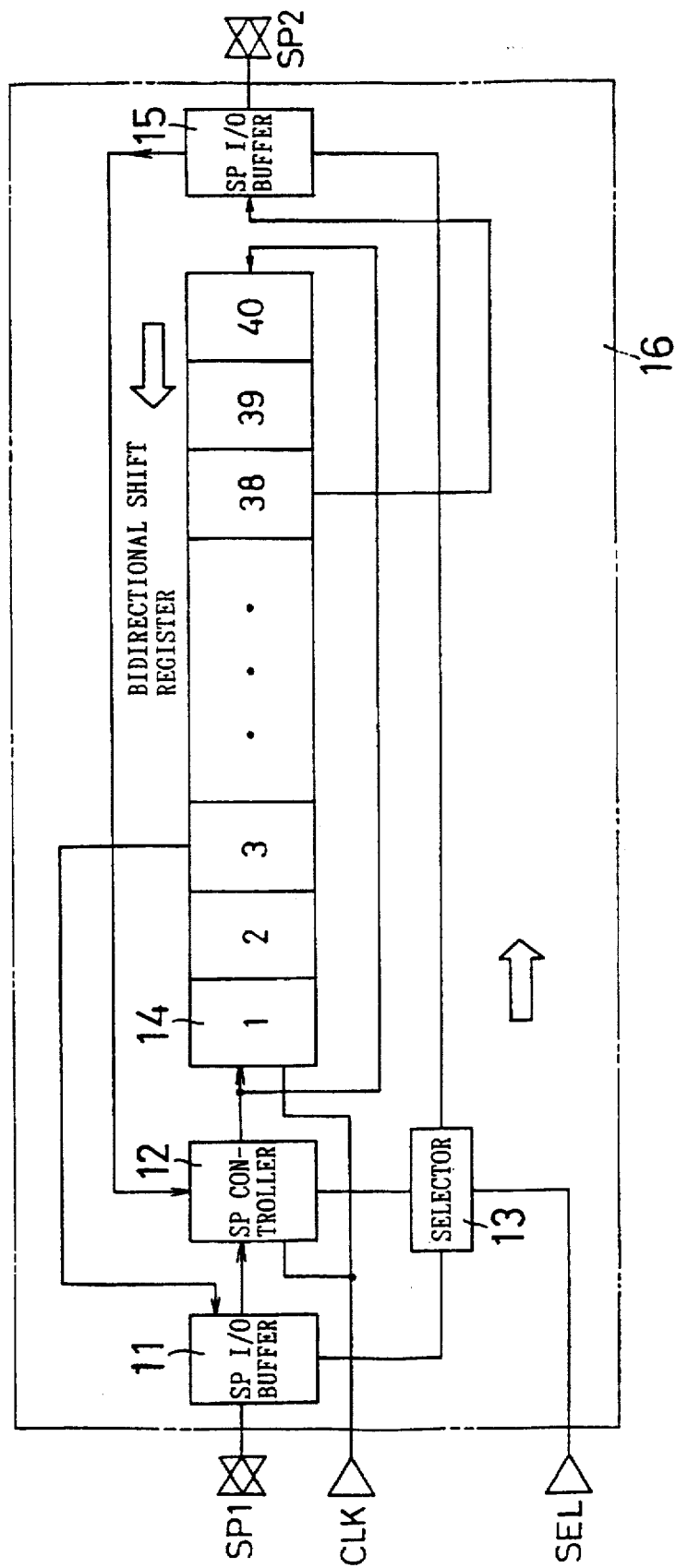
FIG. 1 is a block diagram showing a logical configuration of an embodiment of the invention.

Now referring to the drawings, preferred embodiments of the invention are described below.

FIG. 1 shows a logical configuration of an embodiment of the invention. An input start signal is supplied from a terminal SP1 to an SP_I/O buffer 11 and its pulse width is controlled by an SP control circuit 12. A selection signal SEL is given to a selector circuit 13 so that the data shift direction of a bidirectional shift register 14 is switched between the terminal SP1 and another terminal SP2. When the shift direction is set to be one direction, the input start signal is supplied from a terminal SF01 through the SF I/O buffer 11. When the shift direction is set to be the other direction, the input start signal is supplied from the terminal SP02 through an SP_I/O buffer 15.

Specifically, for example, suppose that the bidirectional shift register 14 has a configuration of 40 stages shift operation. When the selection signal SEL has one logic level, data are shifted in the direction from the first stage to the 40th stage and the output of the 38th stage preceding by two stages the final stage, namely, (the 40th stage) by two stages is derived from the terminal SP2 as an input start signal for a succeeding driver 16. When the selection signal SEL has another logic level, data are shifted in the direction from the 40th stage to the first stage and the output of the third stage preceding the final stage, (the first stage), by two stages is derived from the terminal SP1 as the input start signal for the succeeding driver 16. As the input start signal for the succeeding driver 16 in the case where the drivers 16 are cascade-connected, when the terminal SP2 serves as the output side, the output of the 38th stage is derived. Further when the terminal SP1 serves as the output side, the output of the third stage is derived.

Figure 2:
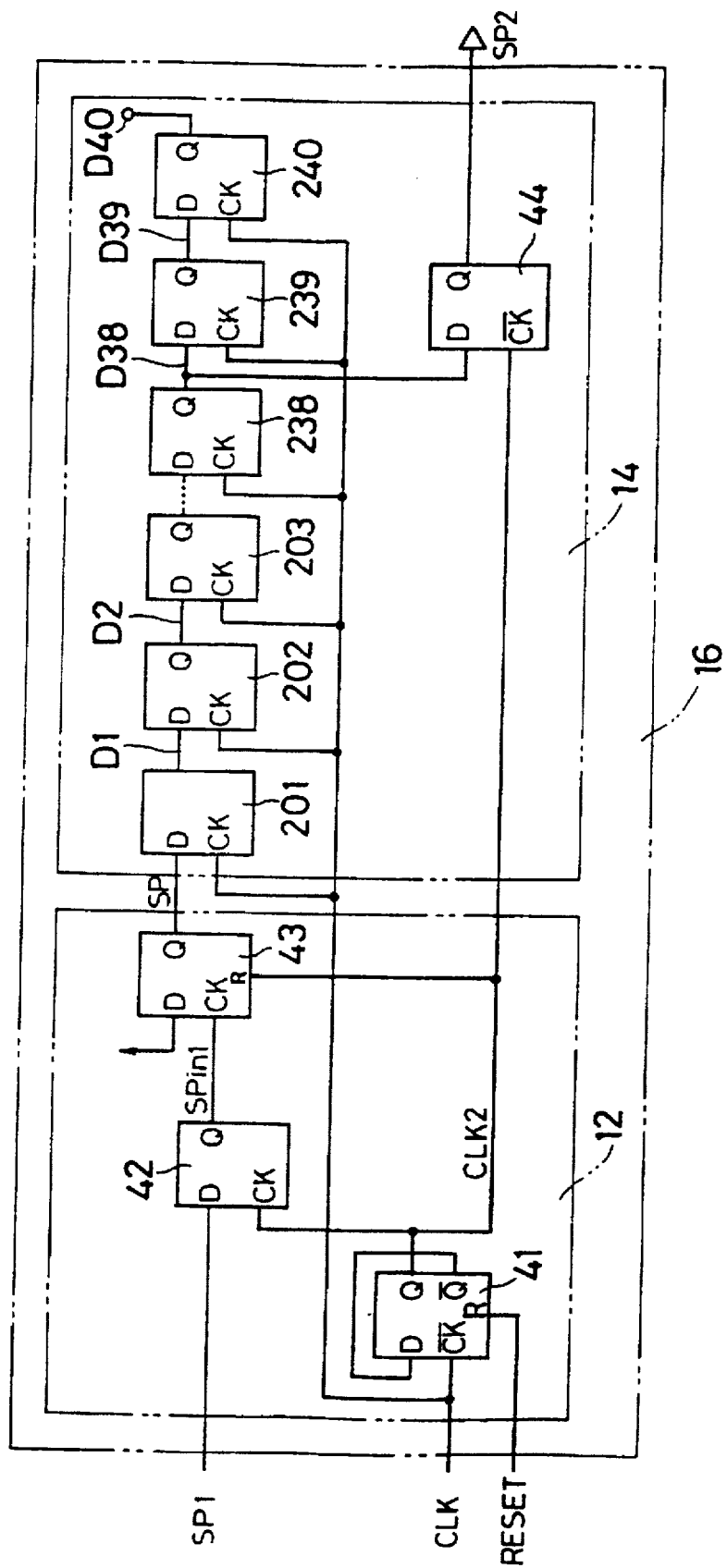
FIG. 2 is a block diagram showing an equivalent electrical configuration in the case where one shift direction is selected in the configuration of FIG. 1.

FIG. 2 shows a simplified electrical configuration in the case where the input start signal is supplied from the terminal SP1 and the output start signal is derived from the terminal SP2. The SP control circuit 12 comprises a D_F/F having a reset terminal (hereinafter, such a D_F/F is abbreviated as "R_F/F") 41, a D_F/F 42, and an R_F/F 43. The bidirectional shift register 14 comprises D_F/Fs 201 240 which are cascade-connected into 40 stages, and a D_F/F 44 which serves as the start signal generating circuit.

A clock signal CLK is commonly given to the clock inputs CK of the R_F/F 41 and D_F/Fs 201 to 240. A reset signal RESET is given to the reset input R of the R_F/F 41. An output which is obtained by inverting the output Q is supplied to the data input D of the R_F/F 41. The output Q of the R_F/F 41 is commonly given to the clock inputs CK of the D_F/F 42 and 44 and to the reset input R of the R_F/F 43. The input start signal is given from the terminal to the data input D of the D_F/F 42. The output Q of the D_F/F 42 is given to the clock input CK of the R_F/F 43. The data input D of the R_F/F 43 is fixed to high level. The output Q of the R_F/F 43 is supplied to the data input D of the D_F/F 201. In the D_F/Fs 201 to 240 which are cascade-connected, the output Q of the preceding stage is given to the input D of the succeeding stage. The output D38 of the D_F/F 238 of the 38th stage is given also to the data input D of the D_F/F 44. As the input start signal for the succeeding driver 16, the output start signal is derived from the output Q of the D_F/F 44 through the terminal SP2.

Figure 3:
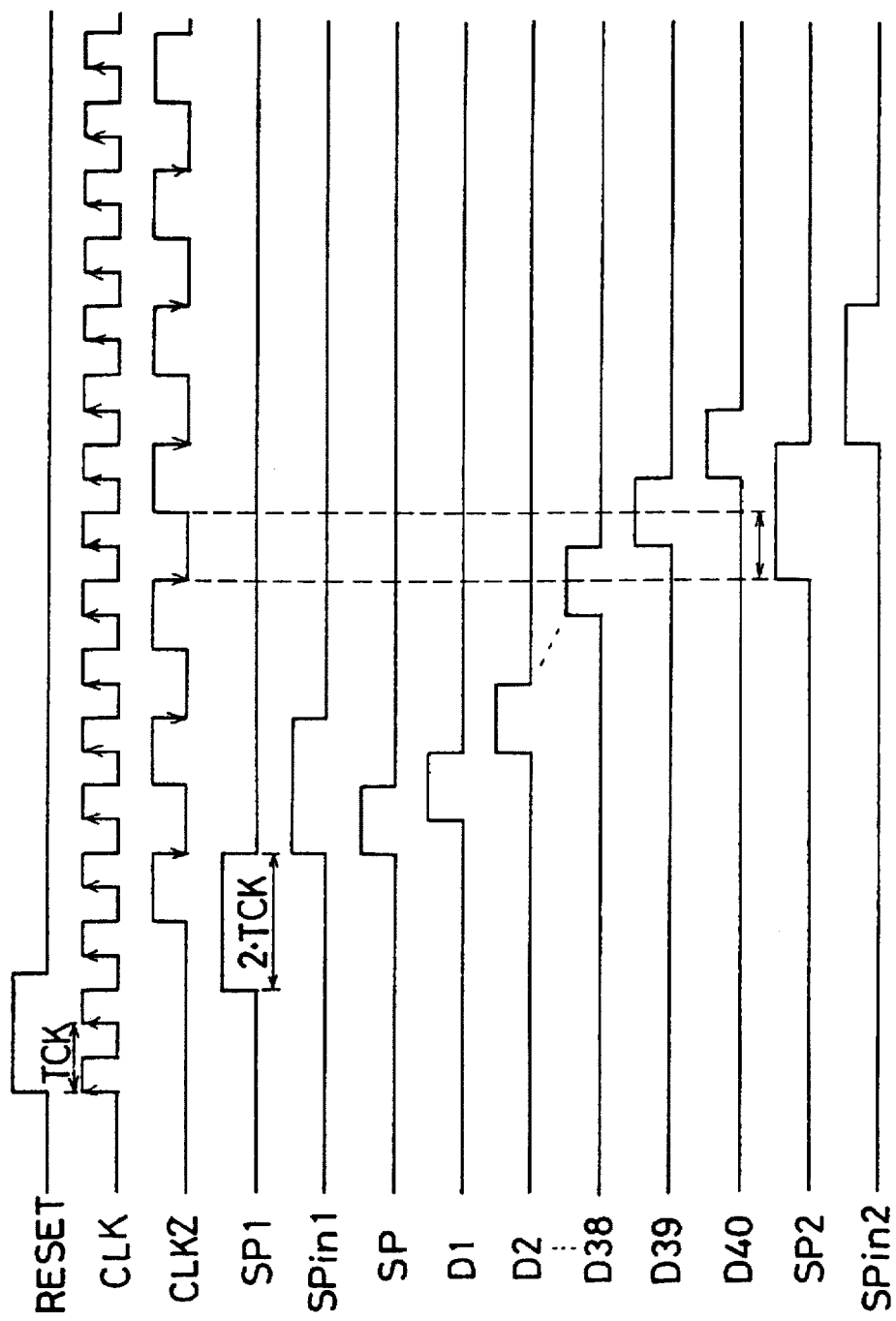
FIG. 3 is a time chart showing the operation of the configuration of FIG. 2.

FIG. 3 shows the operation of the configuration of FIG. 2 in the form of a time chart. When the reset signal RESET which has been raised to high level and then lowered to low level is supplied, the output Q of the R_F/F 41 becomes low. Thereafter, the level of the output Q is alternately inverted at each fall of the clock signal CLK or the R_F/F 41 conducts a 2-frequency division so that a frequency-division clock signal CLK2 of a double cycled is generated. When the input start signal for at least two clock cycles (2·TCK) is input before a fall of the frequency-division clock signal CLK2, a signal SPin1 from the output Q of the D_F/F 42 is made high during a time cycle from a fall of the input start signal to the next fall of the frequency-division clock signal CLK2. The D_F/F 43 is reset during a period when the frequency-division clock signal CLK2 is high, so that the output Q is low. From the output Q, derived is a signal SP which is made high at a rise of the signal SPin1 and maintains the high level until the frequency-division clock signal CLK2 becomes high at the next time or during one cycle of the clock signal CLK. The signal SP in which the pulse width is controlled as described above is given as the start signal from the R_F/F 43 which is start signal control circuit, to the bidirectional shift register 14.

The start signal SP is given to the input D of the D_F/F 201 of the first stage. Then, the output signals D1, D2, ..., D40 of the stages are sequentially derived while being shifted in synchronization with a rise of the clock signal CLK and given to the data input D of the D_F/F of each succeeding stage. The output D38 of the 38th stage is given also to the data input D of the D_F/F 44. From the output Q, a start signal which is high during one cycle of the frequency-division clock signal CLK2, namely, during two cycles of the clock signal CLK, is derived as the output start signal from the terminal SP2 in synchronization with a fall of the frequency-division clock signal CLK2. The D_F/F 42 of the succeeding SP control circuit 12 receives this signal as indicated by SPin2. Since there is a temporal margin of 2 clock cycles, it is possible to surely respond at desired timing even when the clock signal CLK has a higher frequency.

Figure 4:
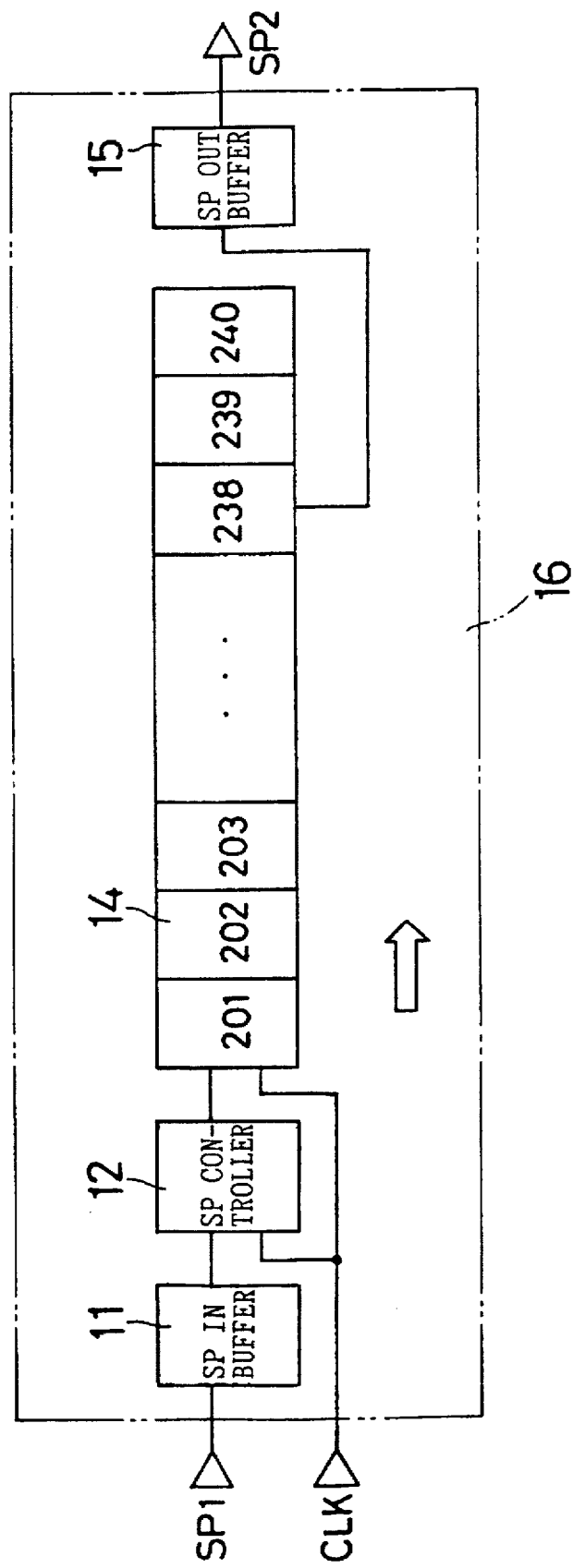
FIG. 4 is a block diagram showing a logical configuration in the case where one shift direction is selected in the embodiment of FIG. 1.
Figure 5:
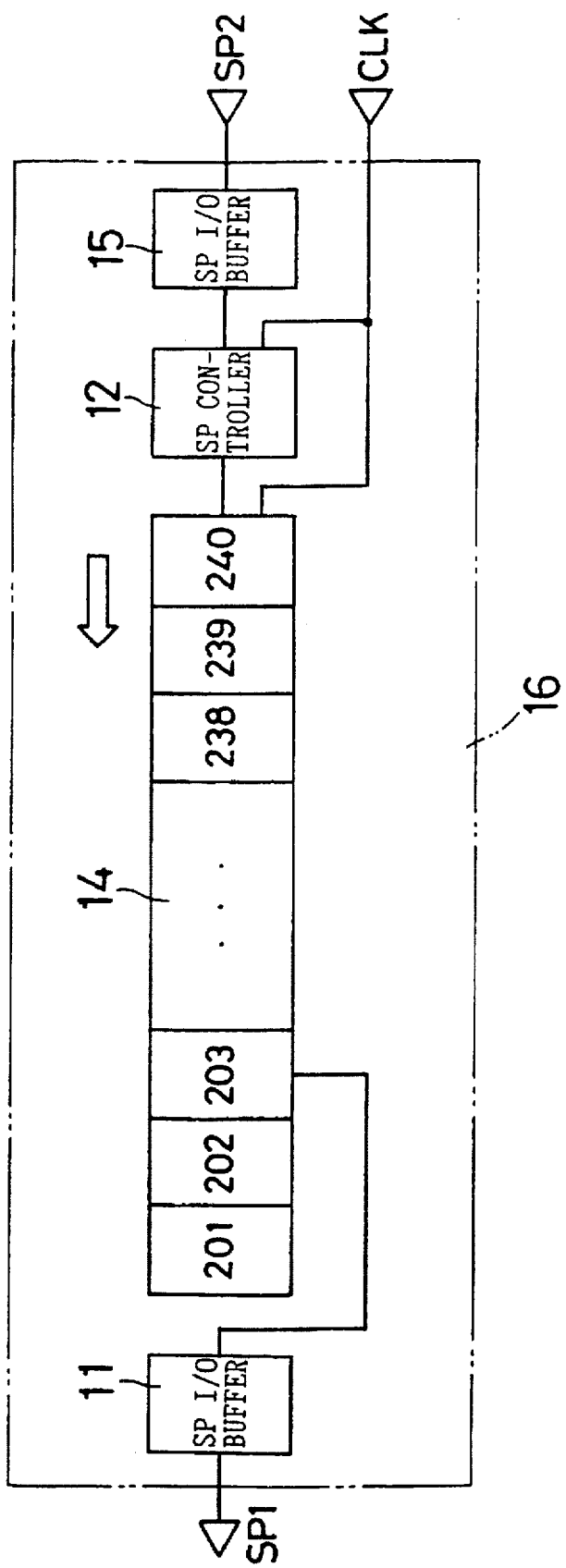
FIG. 5 is a block diagram showing a logical configuration in the case where another shift direction is selected in the embodiment of FIG. 1.

FIGS. 4 and 5 show operation states in the case where the shift direction is switched in accordance with the selection signal SEL, respectively. Depending on the shift direction, the terminals SP1 and SP2 are changed to be the input and the output and vice versa, and also the functions of the SP_I/O buffers 11 and 15 are exchanged for each other.

Figure 6:
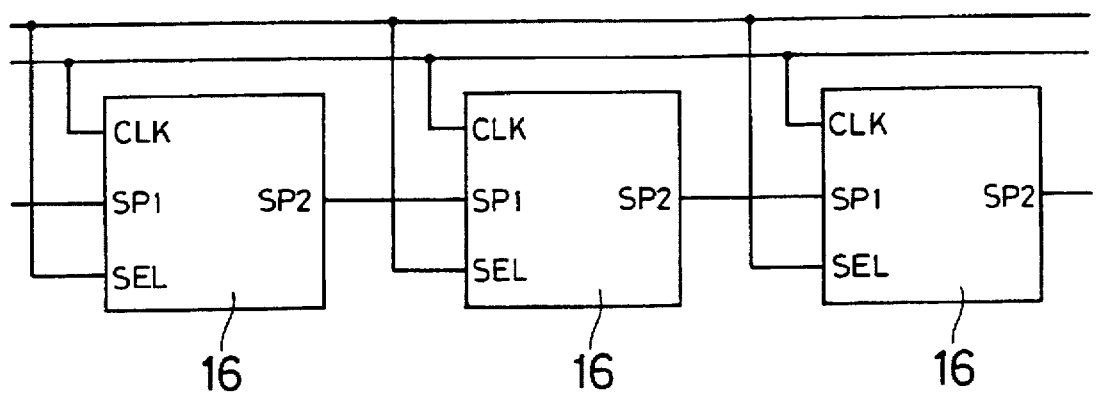
FIG. 6 is a block diagram showing an electrical configuration in the case where a plurality of integrated circuits of the embodiment of FIG. 1 are cascade-connected.

FIG. 6 shows a connection state in the case where a plurality of the drivers 16 are cascade-connected. The clock signal CLK and the selection signal SEL are commonly supplied to the drivers. The adjacent terminals SP1 and SP2 are connected to each other. When the drivers are cascade-connected in this way, a bidirectional shift register is configured as a whole.

Figure 7:
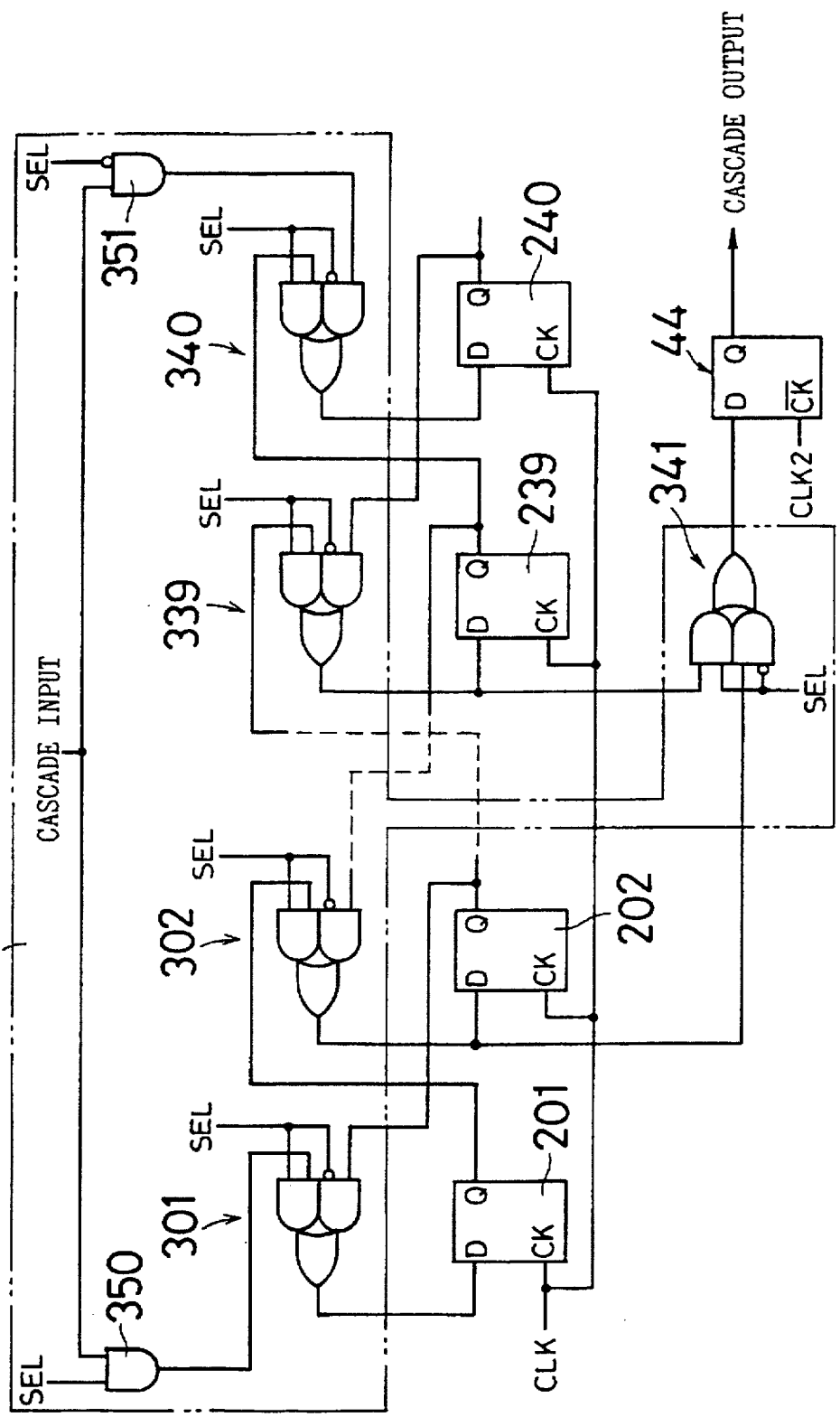
FIG. 7 is an equivalent circuit diagram showing the electrical configuration corresponding to the embodiment of FIG. 1.

FIG. 7 shows a configuration for realizing the bidirectionality in the bidirectional shift register 16. The selector circuit 13 of FIG. 1 comprises selectors 301 to 341 each of which is a combination of AND gates and an OR gate, and AND gates 350 and 351. Each of the selectors 301 to 341 comprises one set of two-input AND gates which are similar to the AND gates 350 and 351. The selection signal SEL causes the two-input AND gates to turn on/off while functioning as the positive logic in one of the two-input AND gates and as the negative logic in the other two-input AND gate. When the selection signal SEL is high, the selectors 302 to 339 select the outputs Q of the D_F/Fs 201 to 238 of the respective preceding stages. When the signal is low, select the outputs Q of the respective succeeding stages. The selectors supply the selected outputs to the inputs D of the D_F/Fs 202 to 239, respectively. When the selection signal SEL is high, the selectors 301 and 340 respectively select the cascade input and the output Q of the D_F/F 239, and, when the signal is low, select the outputs Q of the D_F/F 202 and the cascade input. The selectors supply the selected input and output to the inputs D of the D_F/Fs 201 and 240, respectively. In accordance with the level of the selection signal SEL, the selector 341 selectively switches between the input D of the D_F/F 239 or 202 and that of the D_F/F 44.

Figure 8:
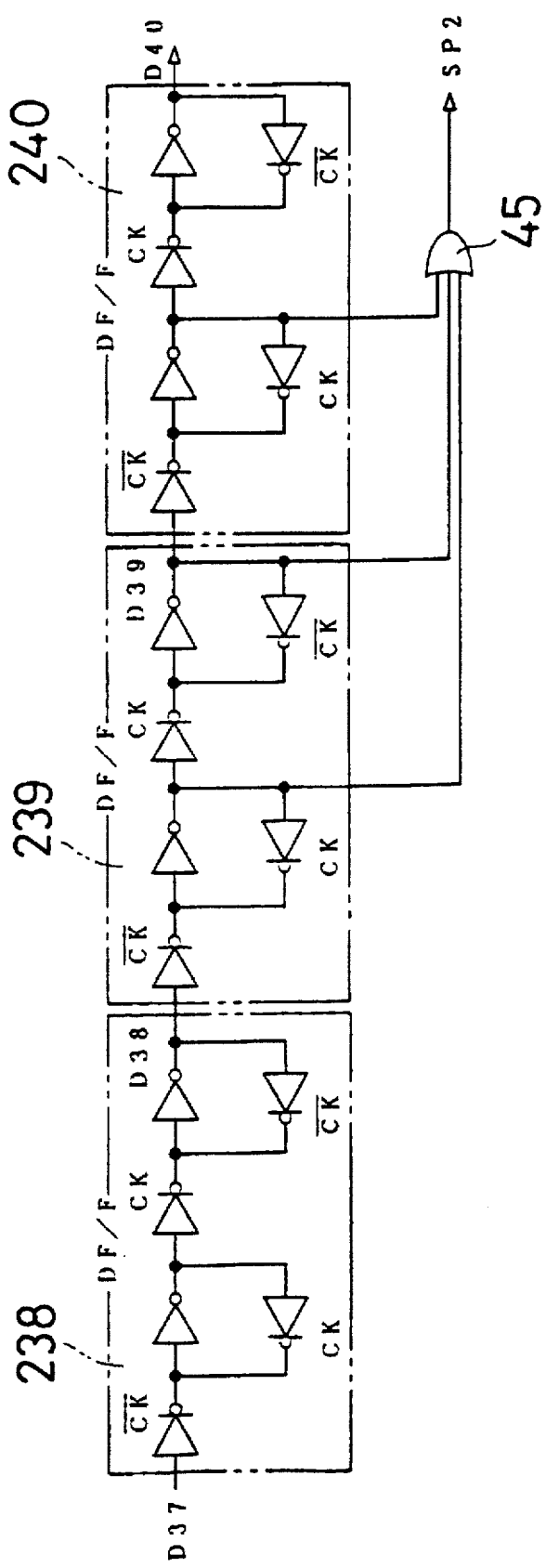
FIG. 8 is an equivalent circuit diagram showing the electrical configuration of another embodiment of the invention.
Figure 9:
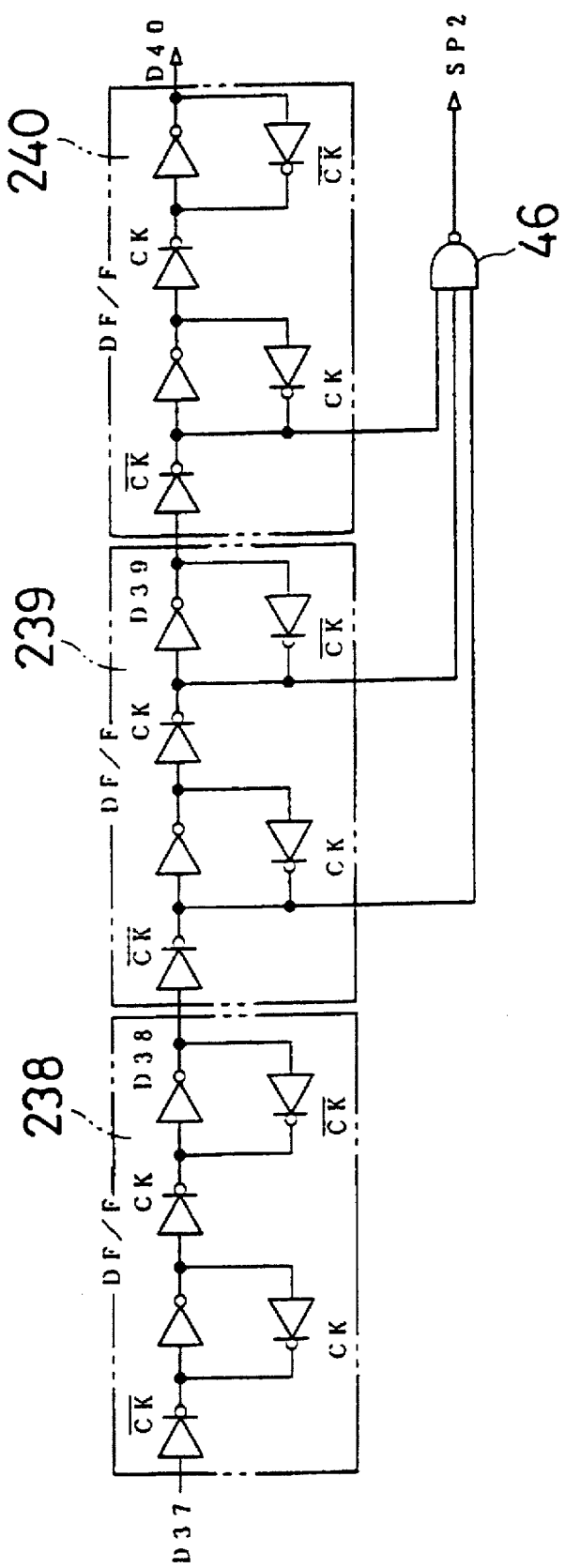
FIG. 9 is an equivalent circuit diagram showing the electrical configuration of a further embodiment of the invention.

FIGS. 8 and 9 show the configuration of the start signal generating circuit in other embodiments of the invention. Each D_F/F shifts a signal by a half-bit and conducts the master-slave operation. In FIG. 8, the output start signal is generated by a three-input OR gate 45 from a logical sum of the half-bit outputs of the front- and rear-half portions of the D_F/F 239 and the front-half portion of the D_F/F 240. In FIG. 9, a three-input NAND gate 46 is used in place of the OR gate 45 of FIG. 8 and a logical product of the half-bit inputs of the front- and rear-half portions of the D_F/F 239 and the front-half portion of the D_F/F 240 is inverted, thereby generating the output start signal. In the forms of the embodiments, the circuit scale can be made smaller than that of the above-described embodiment using the D_F/F 44, thereby enabling the size of a semiconductor chip to be reduced.

Figure 10:
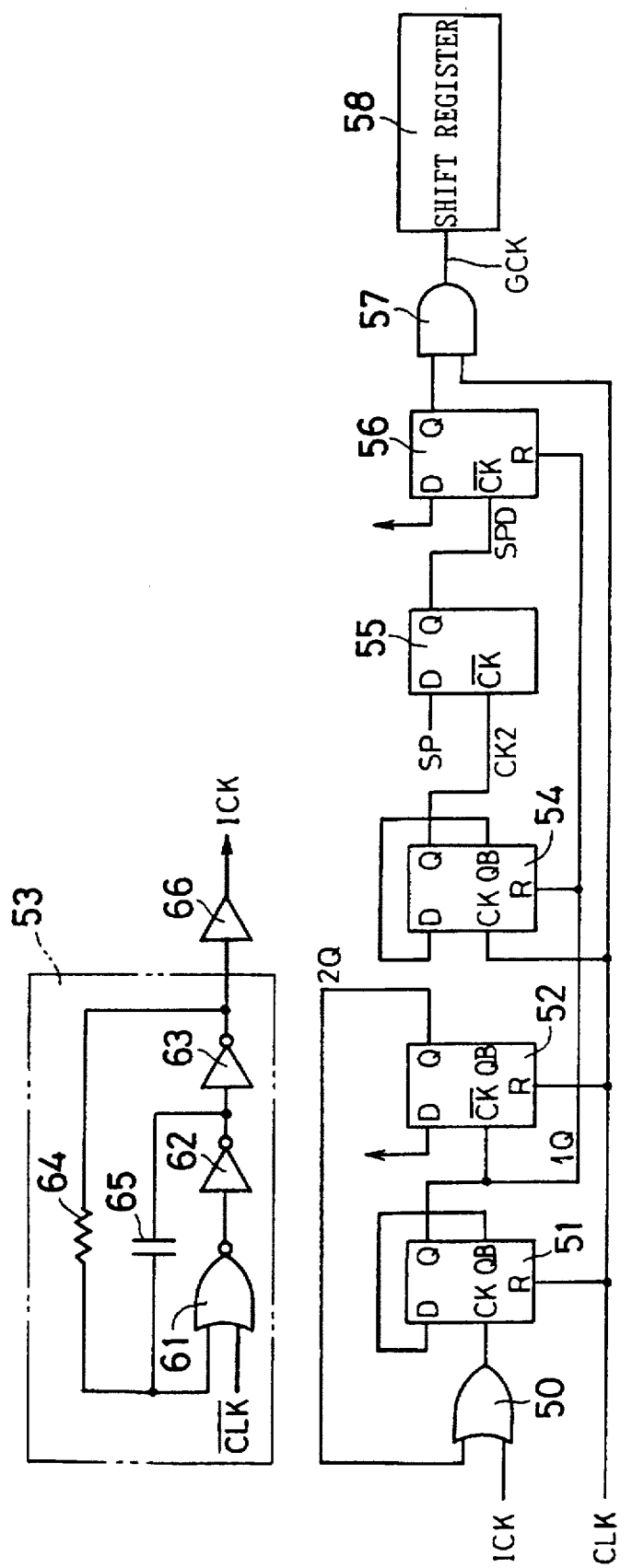
FIG. 10 is an equivalent circuit diagram showing the configuration for initialization in a still further embodiment of the invention.
Figure 11:
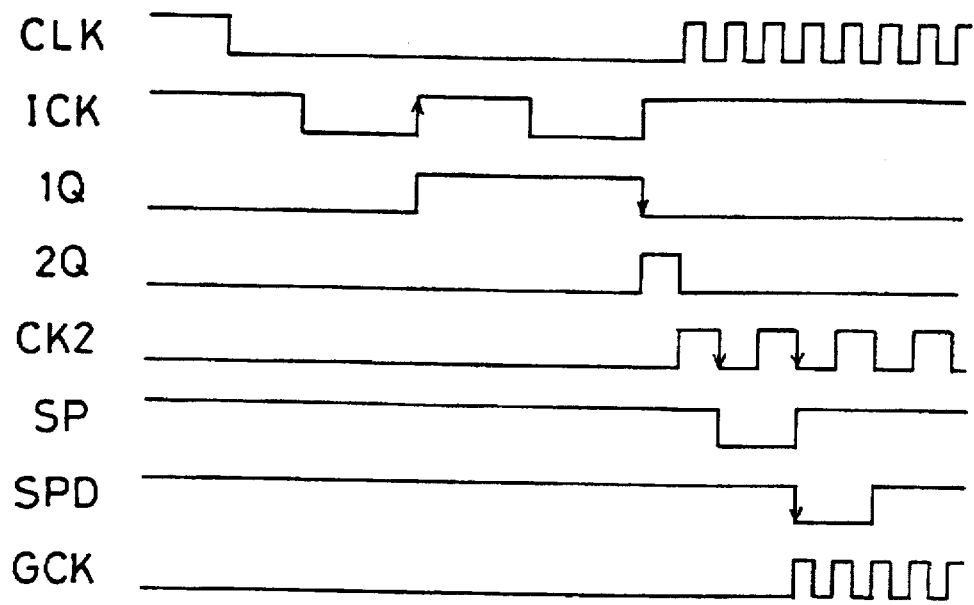
FIG. 11 is a time chart showing the operation of the embodiment of FIG. 10.

FIG. 10 shows a further embodiment of the invention or the configuration of an SP control circuit in which a frequency division circuit is provided with a reset function. FIG. 11 shows the operation of the SP control circuit. An inverted output QB of an R_F/F 51 which operates at a rise of the output of an OR gate 50 is connected to the input D so that the R_F/F constitutes a 2-frequency division circuit. When the output Q falls, an R_F/F 52 in which the input D is fixed to high level is triggered. When the R_F/F 52 is triggered and the output Q becomes high, the R_F/F 51 stops operating.

An R_F/F 54 divides the frequency of the clock signal CLK by 2 so as to generate a frequency-division clock signal CK2. A D_F/F 55 detects that the start signal SP is low in synchronization with a fall of the frequency-division clock signal CK2, and generates a start pulse SPD which is low during one clock cycle. The output Q of an R_F/F 56 is high at a fall of the start pulse SPD so that the clock signal CLK is given as GCK to a bidirectional shift register 58 through an AND gate 57. The bidirectional shift register 58 may have 40 stages in the same manner as the embodiment shown in FIG. 1, or stages of another number.

In the clock signal CLK, a halting time period is provided immediately after the power is turned on. During the time period, an internal oscillator 53 operates. The internal oscillator 53 comprises, for example, a NOR gate 61, inverters 62 and 63, a resistor 64, and a capacitor 65, and generates an internal clock signal ICK. The internal clock signal ICK is output through a buffer 66. The R_F/F 51 divides the frequency of the internal clock signal ICK by 2. When the output 2Q of the R_F/F 52 once becomes high at a fall of the output 1Q of the R_F/F 51, the initialization of the frequency division circuit and the R_F/F 54 is terminated. When the halting time period is ended and the clock signal CLK is supplied under this state, the frequency-division clock signal CK2 is generated in the plurality of integrated circuits at the same phase.

Figures 12A, 12B:
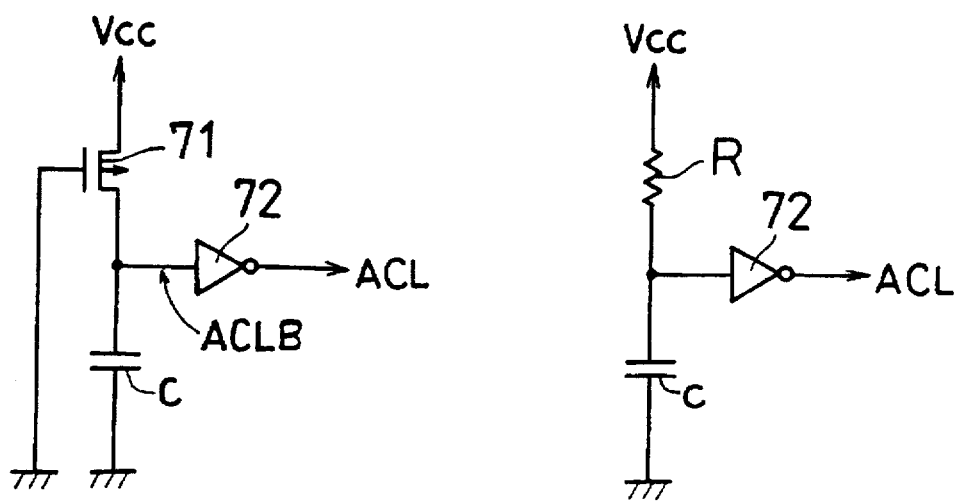
FIGS. 12A and 12B are equivalent circuit diagrams showing the configuration for power-on reset in a still further embodiment of the invention.

FIGS. 12A and 12B show the configuration of a power-on reset circuit using the operation of a capacitor C in which the charging voltage of the capacitor is raised, being delayed from the power-on operation. In FIG. 12A, a P-channel MOS transistor 71 is connected between the power source voltage Vcc and the capacitor C, and, in FIG. 12B, a resistor R is connected. The charging voltage is derived as a signal ACL through an inverter 72.

Figure 13:
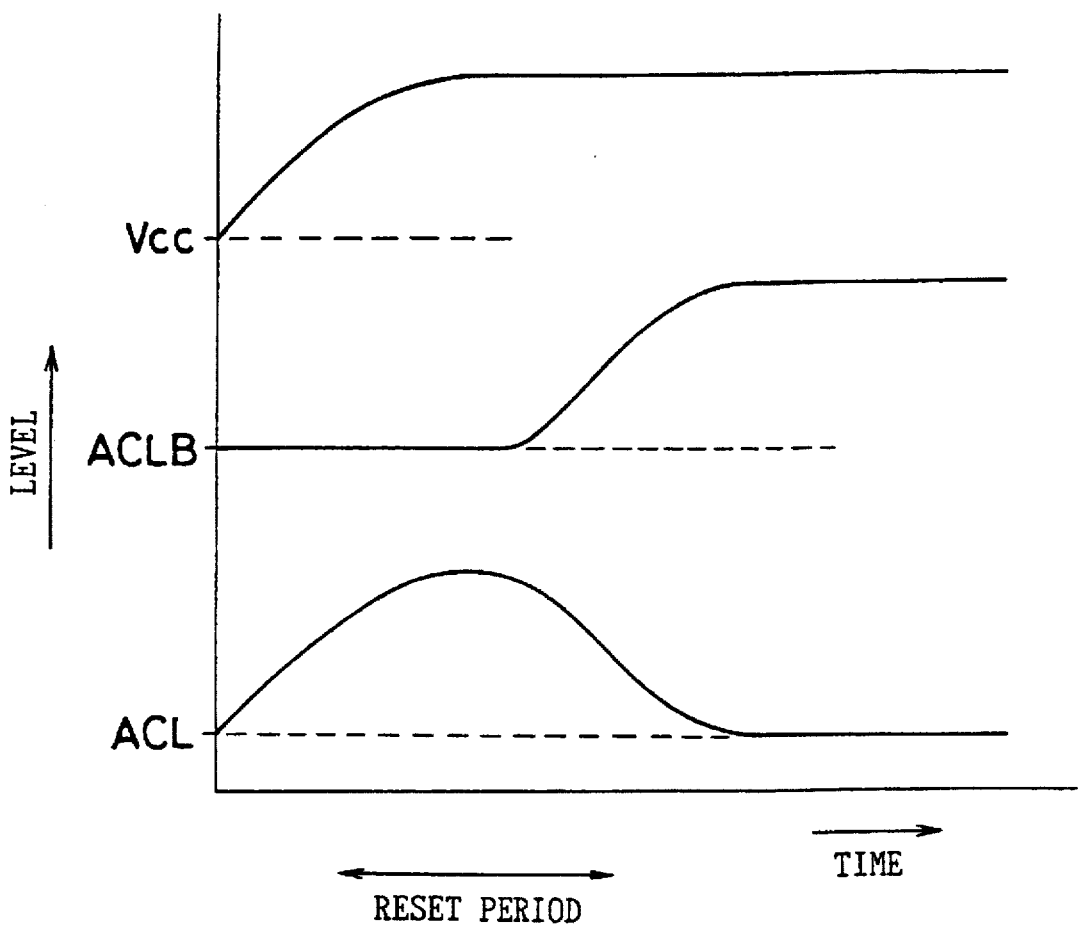
FIG. 13 is a graph showing the operation of the form of the embodiment of FIG. 12A.

FIG. 13 shows the operation of the configuration of FIG. 12A. A charging voltage ACLB rises with delay compared with the power source voltage Vcc. The low-level period serves as the reset period when the signal ACL is high. The configuration of FIG. 12B operates in a similar manner.

Figure 14:
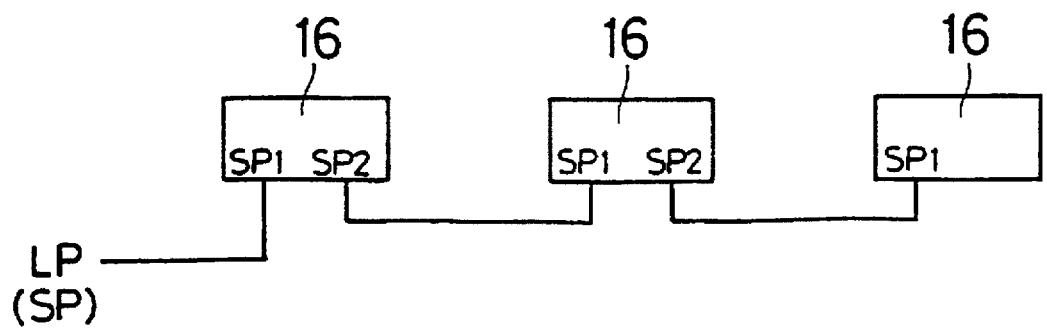
FIG. 14 is a simplified block diagram showing the configuration for conducting initialization in the case of a cascade connection of an embodiment of the invention.
Figure 26:
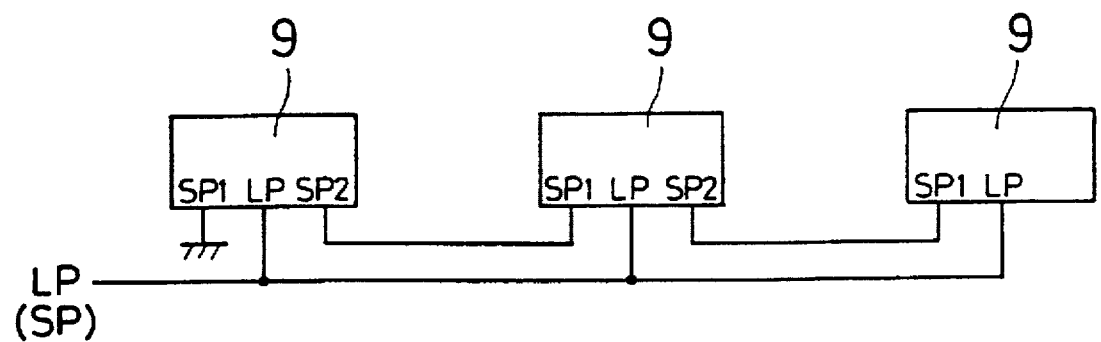
FIG. 26 is a simplified block diagram showing an electrical connection state for initialization in the case where integrated circuits of the prior art are cascade-connected.

The embodiment is provided with the reset function as described above. Accordingly, even when the drivers 16 are cascade-connected as shown in FIG. 14 and a signal line for a latch pulse such as shown in FIG. 26 is omitted, the drivers 16 conduct the frequency division at the same timing and surely function as a whole as one multistage shift register. The omission of a signal line for a latch pulse allows the circuit board on which the drivers are to be mounted, to be easily designed, and eliminates terminals from a package for the integrated circuit, so that the production cost is reduced as a whole. In the above, the bidirectional shift register 14 of 40 stages has been described as an example. The same effects can be attained also when the shift register has stages of another number.

Figure 15:
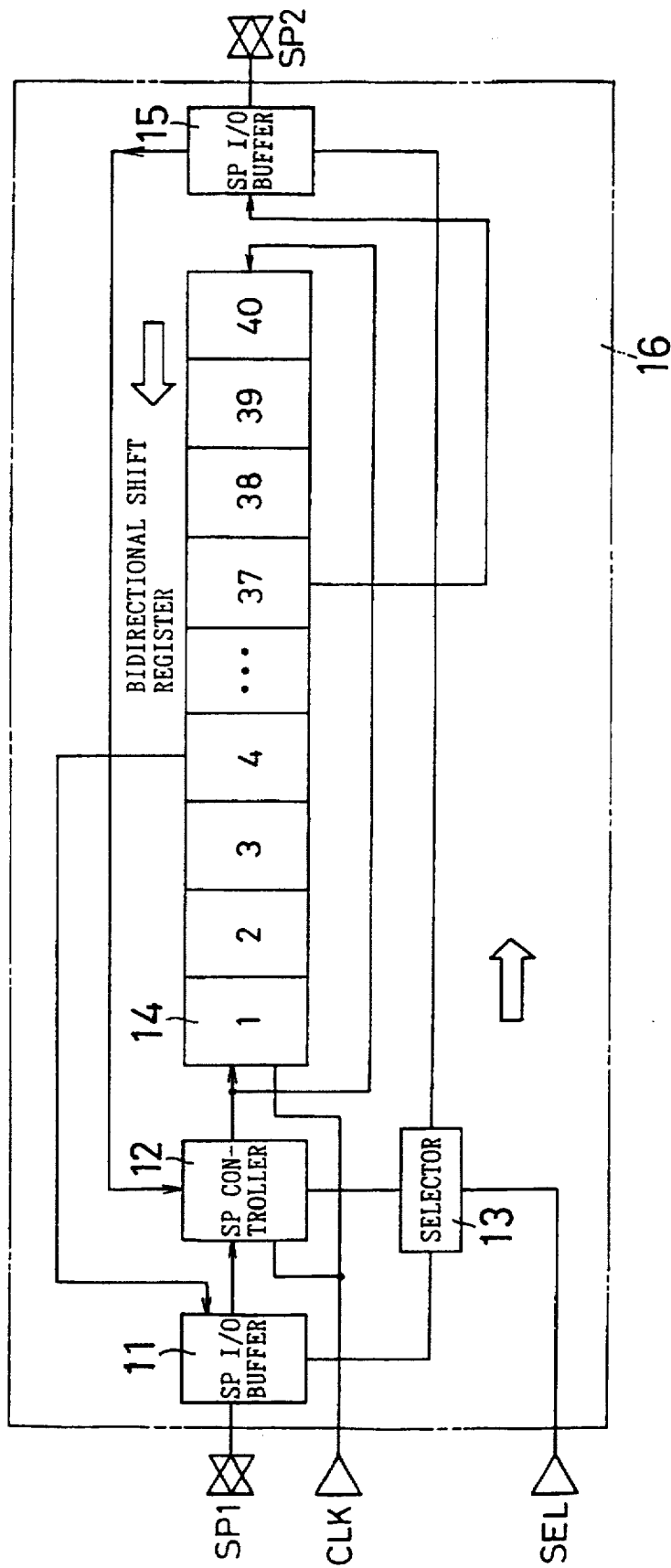
FIG. 15 is a block diagram showing a simplified logical configuration of an embodiment of the invention.

FIG. 15 shows a simplified logical configuration of a still further embodiment of the invention. The same components as those of FIG. 1 are designated by the same reference numerals and their description is omitted.

The start signal is given to the SP_I/O buffer 11 through the terminal SP1, and its pulse width is controlled by the SP control circuit 12. The selection signal SEL is given to the selector circuit 13 so that the data shift direction of the bidirectional shift register 14 is switched between the terminal SP1 and the other terminal SP2.

When a shift operation is to be conducted in the direction from the terminal SP1 to the terminal SP2, the output of the 37th stage which precedes the final stage, namely, the 40th stage, by three stages is derived through the terminal SP2 as the input start signal for the succeeding driver 16. In contrast, when a shift operation is to be conducted in the direction from the terminal SP2 to the terminal SP1, the output of the fourth stage which precedes the final stage, namely, the first stage, by three stages is derived through the terminal SP1 as the input start signal for the succeeding driver 16.

Figure 16:
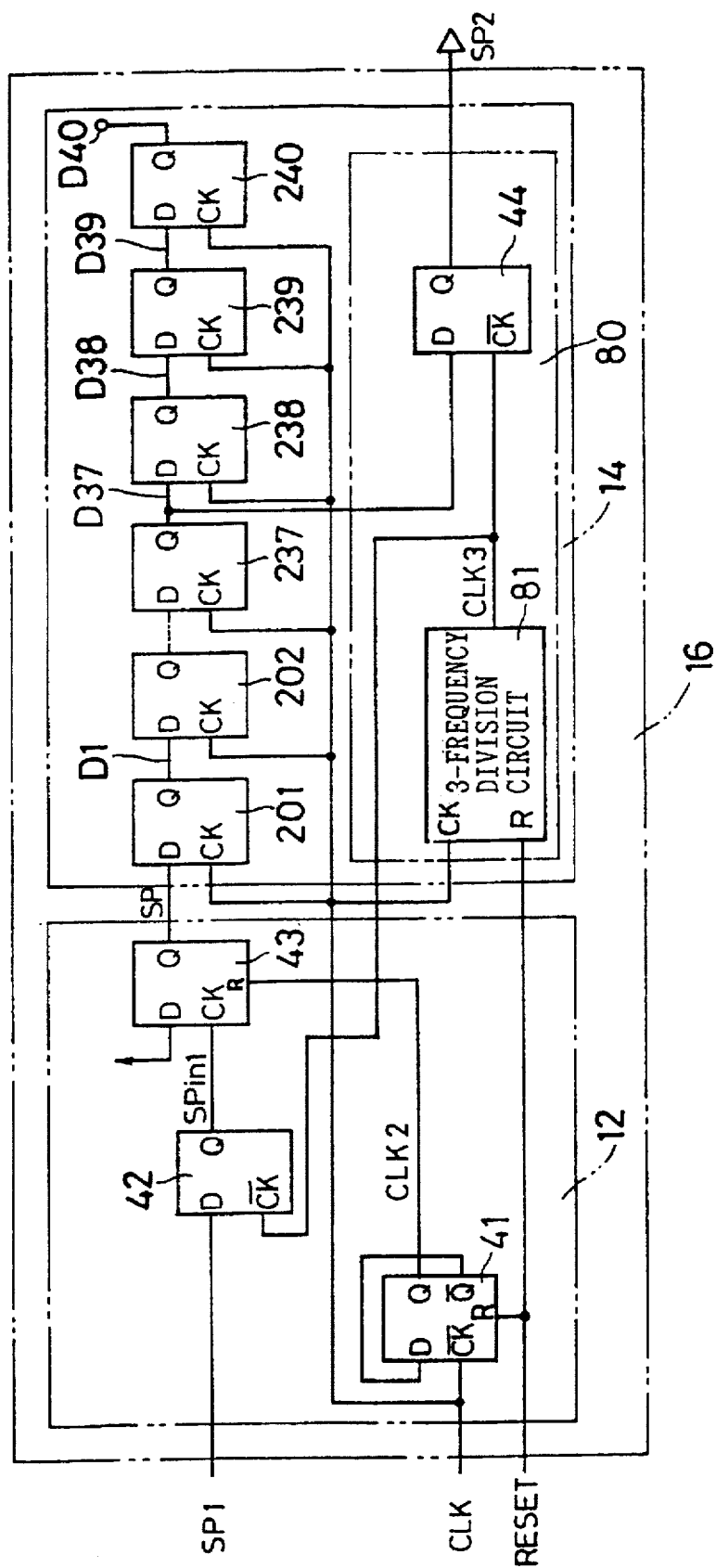
FIG. 16 is a block diagram showing an equivalent electrical configuration in the ease where one shift direction is selected in the configuration of FIG. 15.
Figure 16:
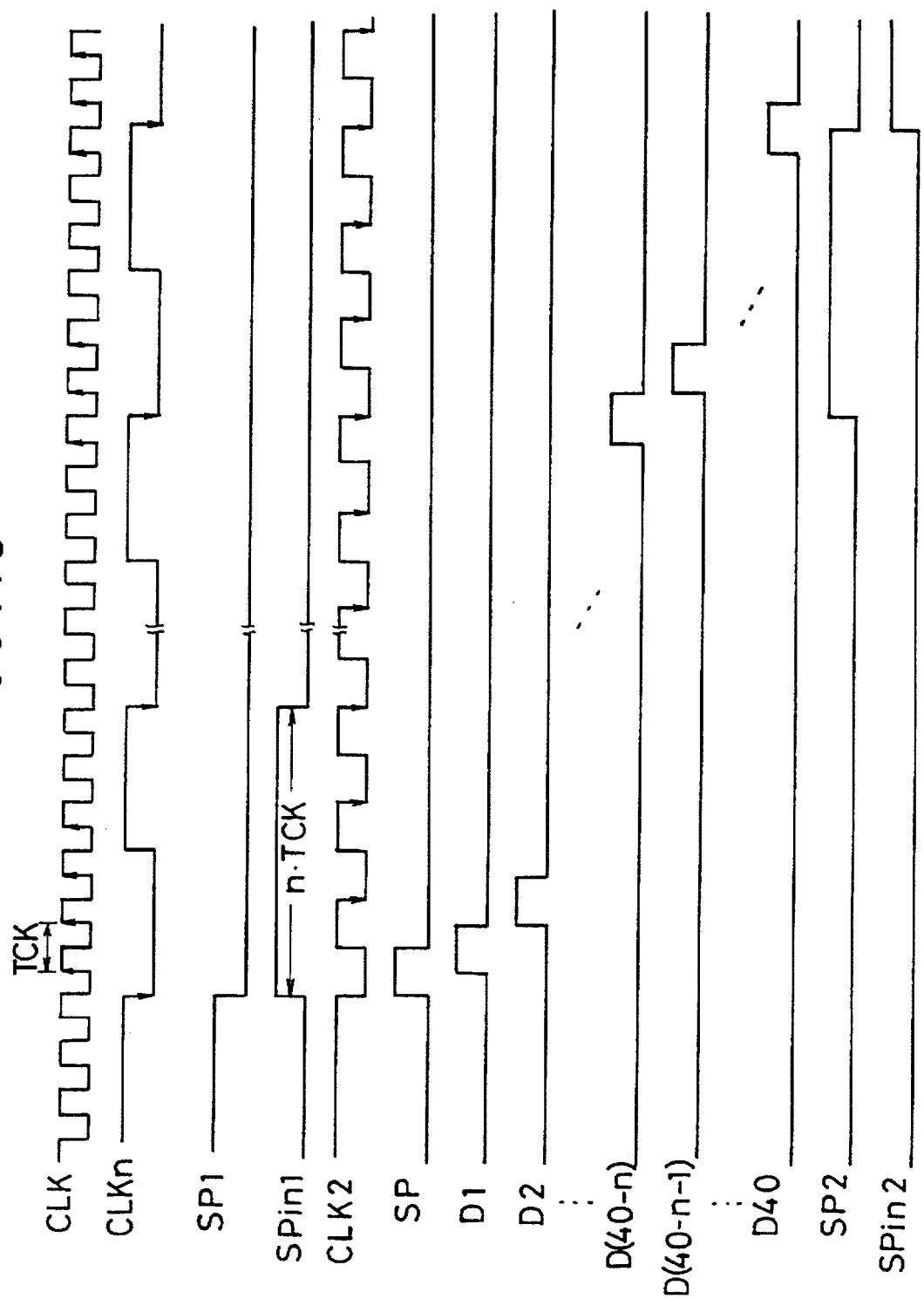

FIG. 16 is a diagram showing a simplified electrical configuration in the case where the input start signal is input through the terminal SP1 and the output start signal is derived through the terminal SP2 in the configuration of FIG. 15. The same components as those of FIG. 2 are designated by the same reference numerals and their description is omitted. The bidirectional shift register 14 comprises the D_F/Fs 201 to 240 which are cascade-connected up to 40 stages, and a start signal generating circuit 80. The start signal generating circuit 80 comprises the D_F/F 44 and a 3-frequency division circuit 81. The clock signal CLK is commonly given to the clock inputs CK of the R_F/F 41, the D_F/Fs 201 to 240, and the 3-frequency division circuit 81. The reset signal RESET is given to the reset inputs R of the R_F/F 41 and the 3-frequency division circuit 81. When the reset signal RESET is input, the R_F/F 41 outputs a first frequency-division clock signal CLK2 of a cycle which is twice one cycle of the clock signal CLK. When the reset signal RESET is input, the 3-frequency division circuit 81 outputs a second frequency-division clock signal CLK3 of a cycle which is three times one cycle of the clock signal CLK. The output of the 3-frequency division circuit 81 is commonly given to the clock inputs CK of the D_F/Fs 42 and 44.

FIG. 17 is a time chart showing the operation of the configuration of FIG. 16. When the reset signal RESET which has been made high and then lowered to low level is supplied, the output Q of the R_F/F 41 and the output of the 3-frequency division circuit 81 are made low. Thereafter, the R_F/F 41 conducts the 2-frequency division operation in which the level of the output Q is alternately changed at each of the succeeding falls of the clock signal CLK, and generates the first frequency-division clock signal CLK2 of a cycle which is twice the cycle TCK of the clock signal CLK.

In the 3-frequency division circuit 81, the output level is raised at the next rise of the clock signal CLK, lowered at a fall of the clock signal after a time period which is 1.5 times the period TCK has elapsed, and raised at a rise of the clock signal after a time period which is 1.5 times the period TCK of the clock signal CLK has elapsed. In other words, the 3-frequency division circuit 81 conducts the 3-frequency division operation in which the level of the output is alternately changed at each elapse of a time period which is 1.5 times the period TCK of the clock signal CLK, and generates the second frequency-division clock signal CLK3 of a cycle which is three times the cycle TCK of the clock signal CLK.

When the input start signal for at least 3 clock cycles (3·TCK) is input to the terminal SP1 before a fall of the second frequency-division clock signal CLK3, the signal SPin1 from the output of the D_F/F 42 is made high after a fall of the input start signal and before the next fall of the frequency-division clock signal CLK3.

During a period when the first frequency-division clock signal CLK2 is high, the D_F/F 43 is reset so that the output Q is low. The output Q is made high at a rise of the signal SPin1, and falls when the first frequency-division clock signal CLK2 is made high at the next time. In other words, a signal which is high only during a time period corresponding to one period of the clock signal CLK is derived from the output Q. The SP control circuit 12 gives the signal SP of a controlled pulse width to the bidirectional shift register 14 as the start signal.

When the start signal SP is given to the input D of the D_F/F 201 of the first stage of the bidirectional shift register 14, the D_F/Fs of the stages are shifted in synchronization with a rise of the clock signal CLK and the output signals D1 to D40 of the stages are sequentially derived. The output D37 of the D_F/F 237 of the 37th stage is given to the input D of the D_F/F 238 and also to the input D of the D_F/F 44.

The output Q of the D_F/F 44 is output through the output terminal SP2 to the succeeding driver 16 as the output start signal which is high during one cycle of the second frequency-division clock signal CLK3, namely, during three cycles TCK (3·TCK) of the clock signal CLK in synchronization with a fall of the second frequency-division clock signal CLK3. The D_F/F 42 of the SP control circuit 12 of the succeeding driver 16 receives a signal which is high during one cycle of the second frequency-division clock signal CLK3, as indicated by SPin2 in FIG. 17.

Since there is a temporal margin of 3 clock cycles in the output start signal supplied to the SP control circuit 12 of the succeeding driver 16, it is possible to surely respond at desired timing even when the clock signal CLK has a higher frequency. Consequently, the output D1 of the D_F/F 201 of the first stage of the bidirectional shift register 14 of the succeeding driver 16 is output in succession to the output D40 of the D_F/F 240 or without delay.

FIG. 18 is a time chart showing the operation of the configuration in which an output of a stage preceding by n stages (n being an integer not less than 3) the final stage of the bidirectional shift register 14 is used for outputting a signal from the output terminal SP2. The configuration in which the start signal is output by using the output of the D_F/F preceding by n stages the final stage of the bidirectional shift register 14 is similar to that shown in FIG. 15 or 16. The 3-frequency division circuit 81 of the start signal generating circuit 80 shown in FIG. 16 is replaced with an n-frequency division circuit. The n-frequency division circuit receives the clock signal CLK and the reset signal RESET and conducts an n-frequency division on the clock signal to output a second frequency-division clock signal CLKn of a cycle which is n times the cycle TCK of the clock signal CLK. The start signal is output by using the output Q of the D_F/F preceding by n stages the final stage of the bidirectional shift register 14.

When the reset signal RESET is supplied to the R_F/F 41 and the n-frequency division circuit, the R_F/F 41 receives the clock signal CLK and conducts the 2-frequency division operation so that the first frequency-division clock signal CLK2 of a cycle which is twice the cycle TCK of the clock signal CLK is generated. The n-frequency division circuit receives the clock signal CLK and conducts the n-frequency division operation so that the second frequency-division clock signal CLKn of a cycle which is n times the cycle TCK of the clock signal CLK is generated.

When the input start signal for at least n clock cycles (n·TCK) is input, the signal SPin1 from the output Q of the D_F/F 42 is made high during a time period from a fall of the input start signal to the next fall of the second frequency-division clock signal CLKn. The signal SP which is high during only one cycle of the clock signal CLK is derived from the D_F/F 43 until the first frequency-division clock signal CLK2 becomes high. In other words, the D_F/F 43 outputs the signal SP of a controlled pulse width.

When the signal SP is given to the input D of the D_F/F 201 of the first stage of the bidirectional shift register 14, the D_F/Fs of the stages are shifted in synchronization with a rise of the clock signal CLK and the output signals D1 to D40 of the stages are sequentially derived. The output of the D_F/F of the (40-n)th stage is given to the input D of the D_F/F of the next stage and also to the input D of the D_F/F 44.

The output Q of the D_F/F 44 is output through the output terminal SP2 to the succeeding driver 16 as the output start signal which is high during one cycle TCK (n·TCK) of the second frequency-division clock signal CLKn in synchronization with a fall of the second frequency-division clock signal CLKn. The D_F/F 42 of the SP control circuit 12 of the succeeding driver 16 receives a signal which is high during one cycle of the second frequency-division clock signal CLKn, as indicated by SPin2 in FIG. 18.

Since there is a temporal margin of n clock cycles (n·TCK) in the output start signal supplied to the SP control circuit 12 of the succeeding driver 16, it is possible to surely respond at desired timing even when the clock signal CLK has a higher frequency. Consequently, the output D1 of the D_F/F 201 of the first stage of the bidirectional shift register 14 of the succeeding driver 16 is output in succession to the output D40 of the D_F/F 240 or without delay.

Figure 19:
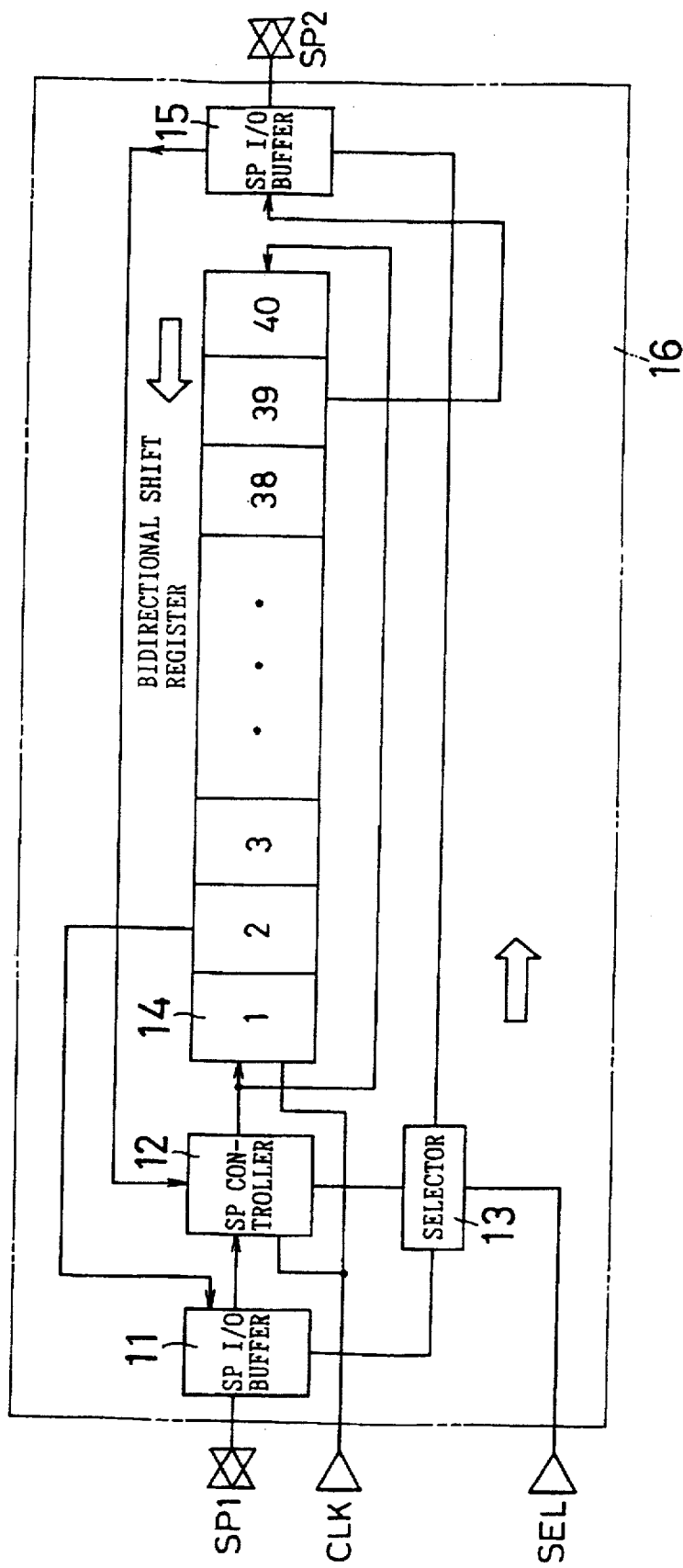
FIG. 19 is a block diagram showing a logical configuration showing a still further embodiment of the invention.

FIG. 19 is a block diagram showing a logical configuration showing a still further embodiment of the invention. The same components as those of FIG. 1 are designated by the same reference numerals and their description is omitted. The start signal is given to the SP_I/O buffer 11 through the terminal SP1, and its pulse width is controlled by the SP control circuit 12. The selection signal SEL is given to the selector circuit 13 so that the data shift direction of the bidirectional shift register 14 is switched between the terminal SP1 and the other terminal SP2.

When a shift operation is to be conducted in the direction from the terminal SP1 to the terminal SP2, the output of the 39th stage preceding the final stage (the 40th stage) by one stage is derived through the terminal SP2 as the input start signal for the succeeding driver 16. In contrast, when a shift operation is to be conducted in the direction from the terminal SP2 to the terminal SP1, the output of the second stage preceding the final stage (the first stage) by one stage is derived through the terminal SP1 as the input start signal for the succeeding driver 16.

Figure 20:
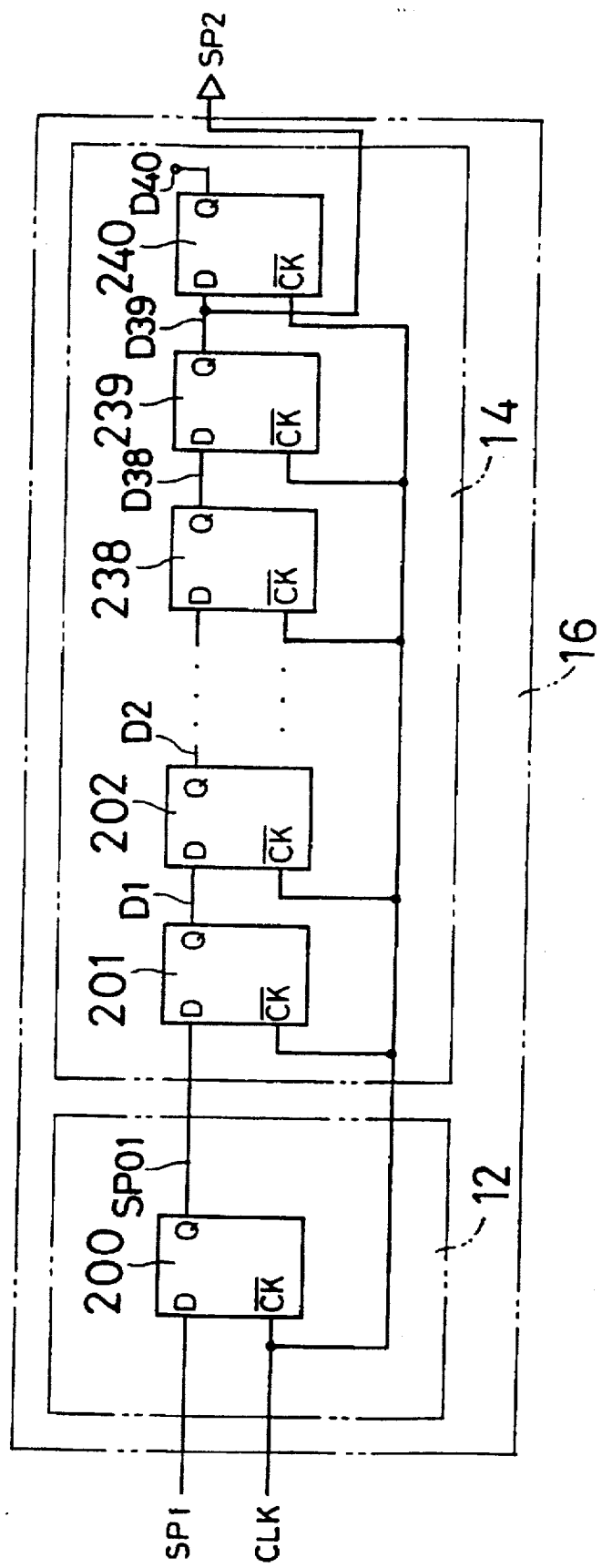
FIG. 20 is a block diagram showing an equivalent electrical configuration in the case where one shift direction is selected in the configuration of FIG. 19.

FIG. 20 is a diagram showing a simplified electrical configuration in the case where the input start signal is input through the terminal SP1 and the output start signal is derived through the terminal SP2 in the configuration of FIG. 19. The same components as those of FIG. 2 are designated by the same reference numerals and their description is omitted.

Figure 21:
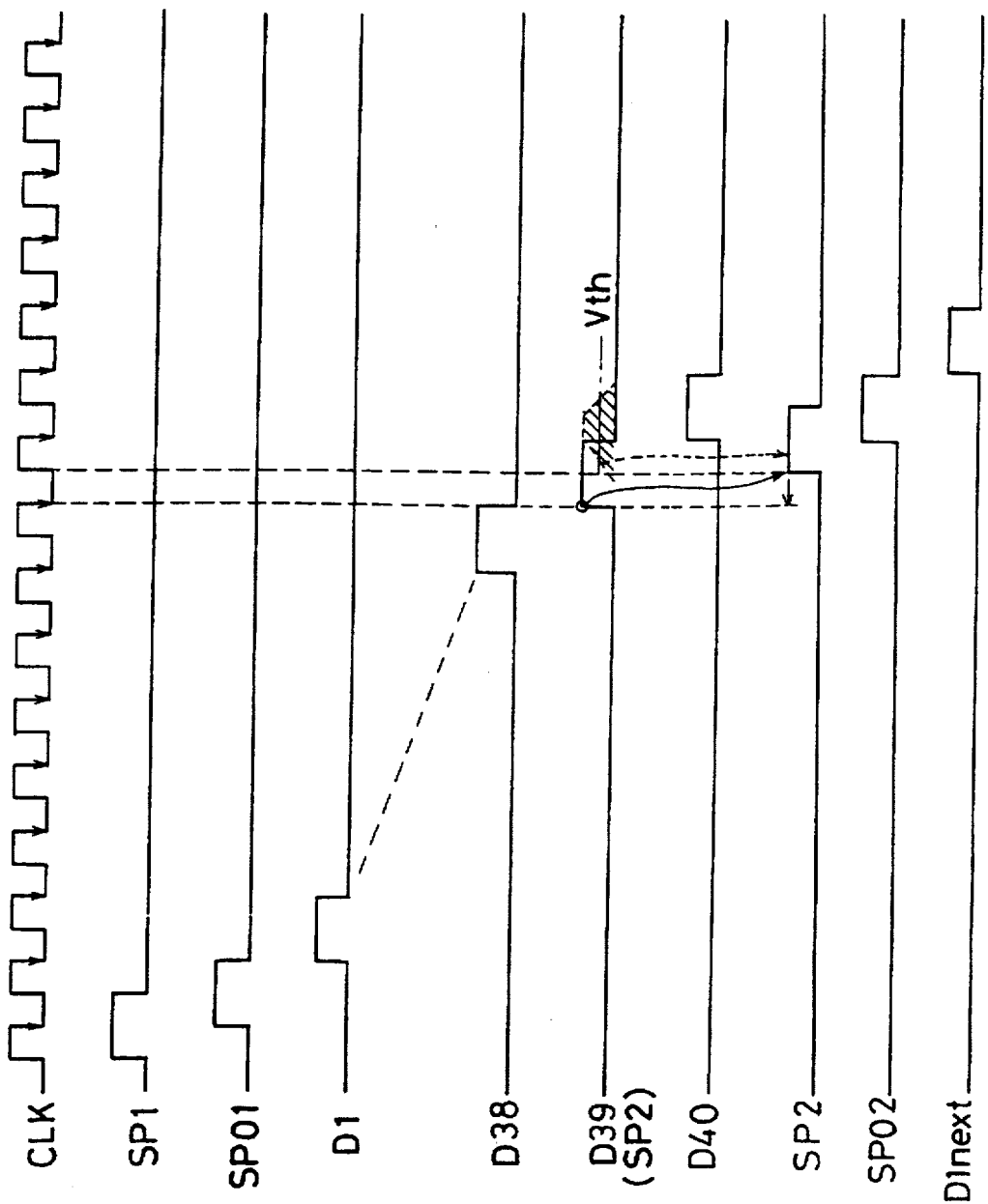
FIG. 21 is a time chart showing the operation of the configuration of FIG. 20.
Figure 22:
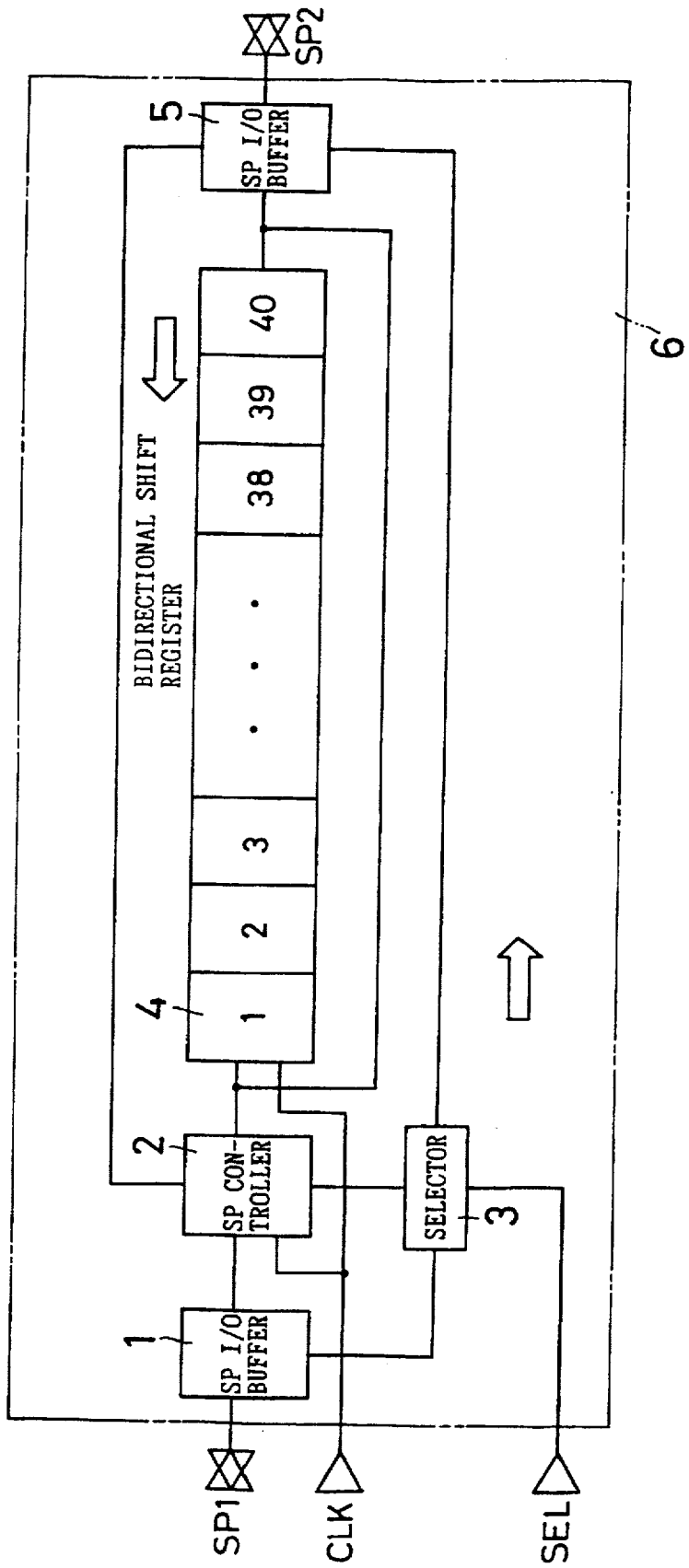
FIG. 22 is a block diagram showing a logical configuration of the prior art.
Figure 23A:
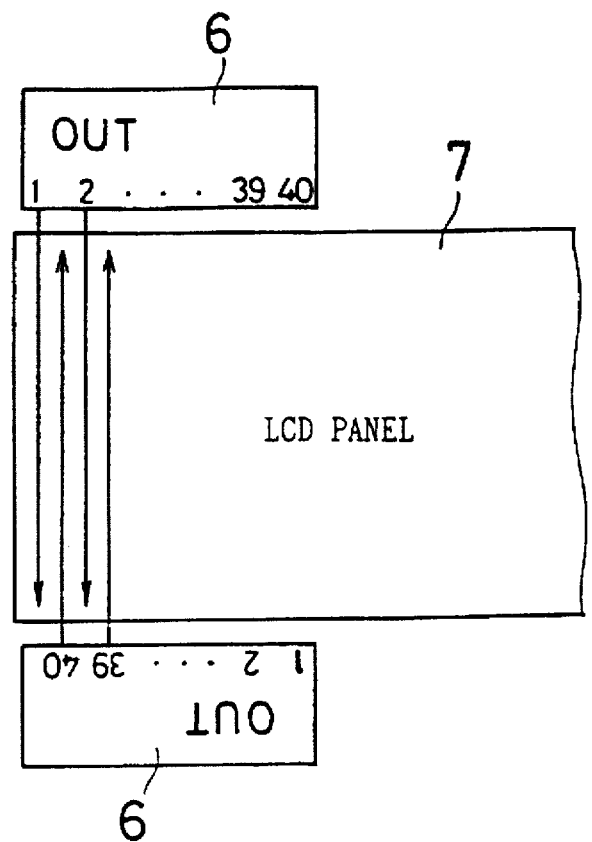
FIGS. 23A and 23B are block diagrams showing an electrical configuration which is simplified for illustrating the necessity of bidirectionality.
Figure 23B:
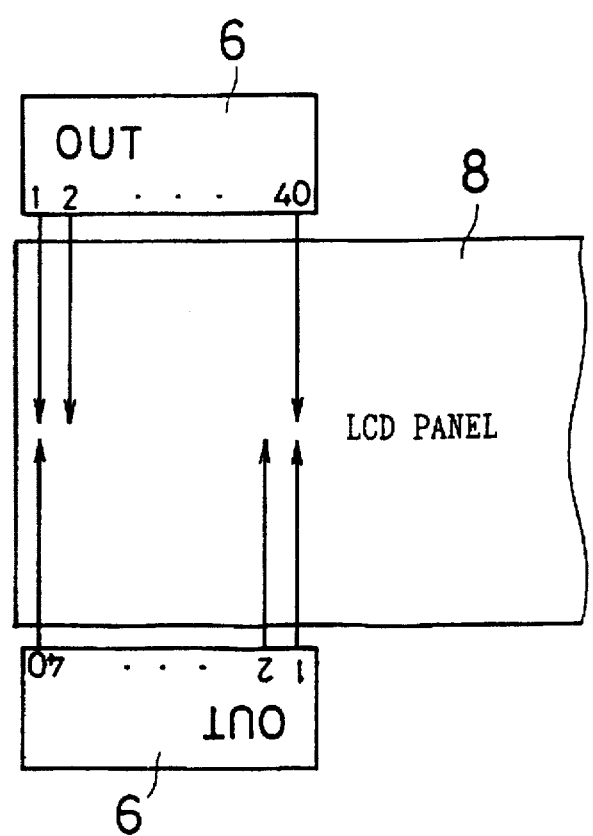
Figure 24:
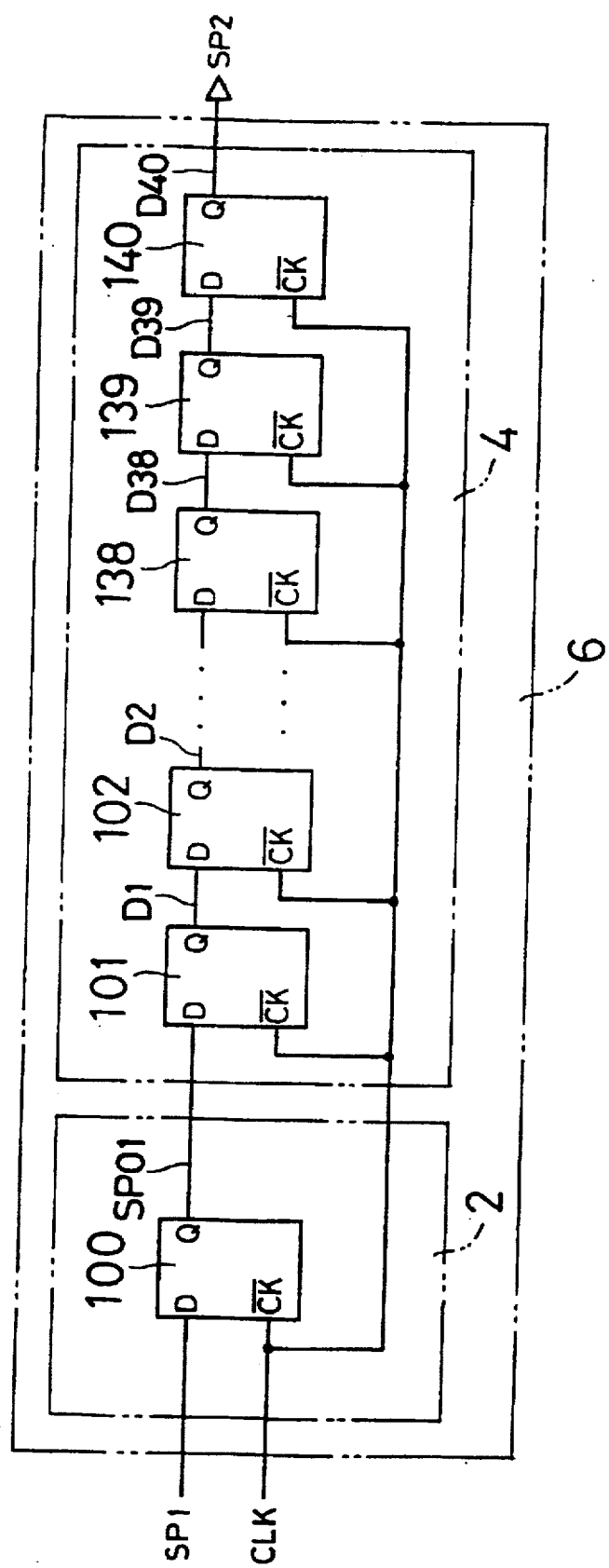
FIG. 24 is a block diagram showing an equivalent electrical configuration of FIG. 22.
Figure 25:
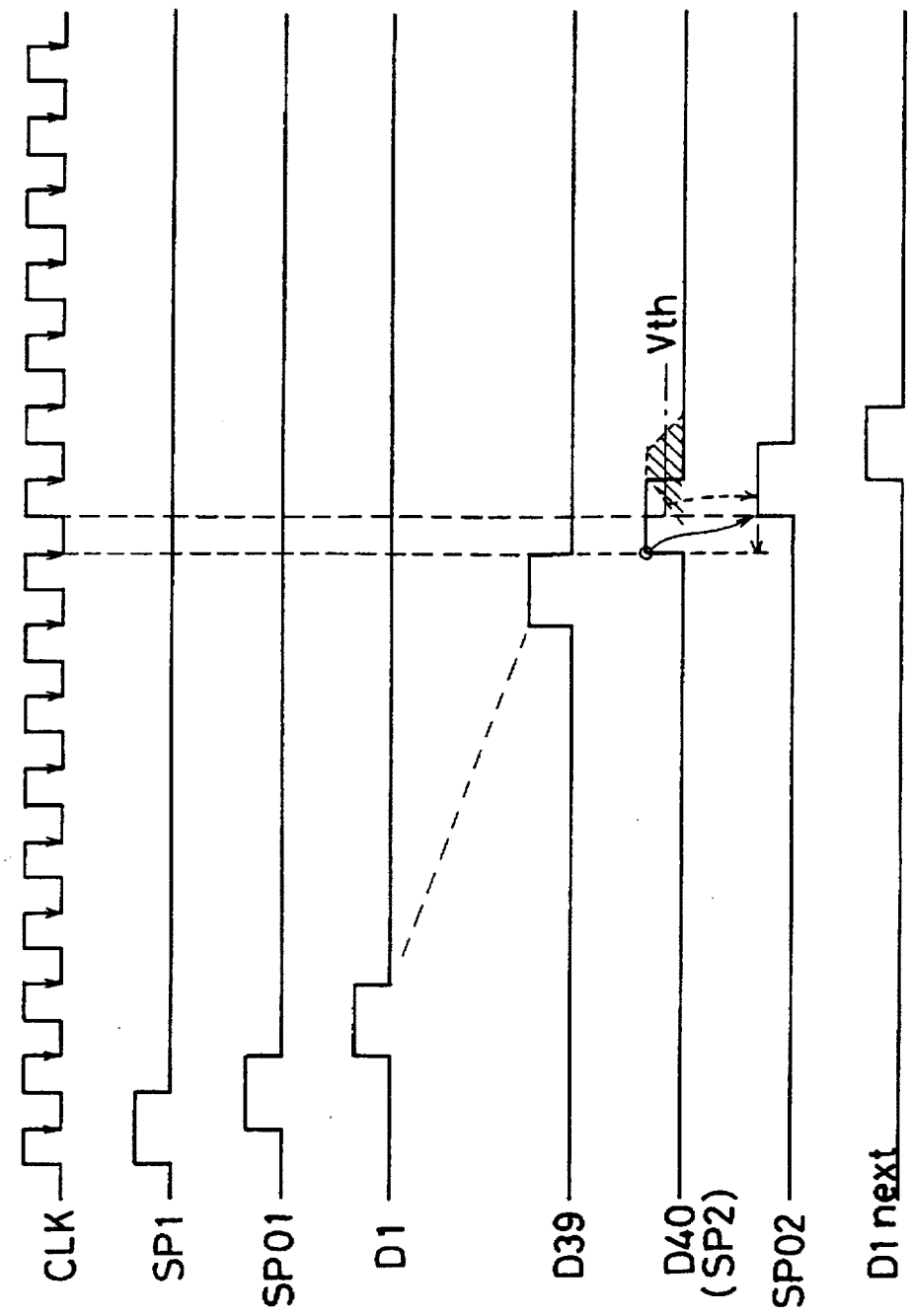
FIG. 25 is a time chart showing the operation of the configuration of FIG. 24.

The SP control circuit 12 comprises a D_F/F 200. In the D_F/F 200, the input start signal is given to the input D and the clock signal CLK to the clock input CK. The D_F/F 200 outputs the start signal SP01 from the output Q to the bidirectional shift register 14. FIG. 21 shows the operation of the configuration of FIG. 20. When a signal is given to the terminal SP1 as the input start signal, the output SPO1 of the D_F/F 200 rises at the first fall of the clock signal CLK and falls at the next rise of the clock signal CLK.

When the start signal SP is given to the input D of the D_F/F 201 of the bidirectional shift register 14, the output signals D1 to D40 of the stages are sequentially derived while shifting the D_F/Fs of the stages, in synchronization with a rise of the clock signal CLK. The output of the D_F/F 239 of the 39th stage is output from the output terminal SP2 to the succeeding driver 16 as the output start signal.

As described in the paragraph of the prior art, in the case where the output Q of the D_F/F 240 of the 40th stage of the bidirectional shift register 14 is output to the succeeding driver 16 as the output start signal, the waveform of the start signal SP2 is rounded by the input capacitance of the succeeding driver 16, the stray capacitance of the wiring, and the like. The start signal in which the waveform is rounded is delayed by, for example, a half to one cycle of the clock signal CLK. This causes data to be lost, and hence the whole configuration cannot operate as one shift register.

In the embodiment, the output Q of the 39th stage which precedes the final stage of the bidirectional shift register 14 by one stage is output to the succeeding driver 16 as the output start signal. As shown in FIG. 21, this produces a temporal margin even when the waveform of the start signal SP2 is rounded by the input capacitance of the succeeding driver 16, the stray capacitance of the wiring, and the like and the start signal SP2 is delayed by, for example, a half to one cycle as indicated by hatching.

Consequently, the start signal SP2 of the succeeding driver 16 is raised at least at a rise of the output D40 of the D_F/F 240, and the output D1next of the first stage of the bidirectional shift register 14 of the succeeding driver 16 is surely raised at a fall of the output of the D_F/F 240. This enables the whole of the cascade-connected drivers to operate as one shift register.

The above-described delay of the start signal SP2 caused by the waveform rounding depends on the relative relationship between the clock signal CLK and the start signal SP2. Specifically, as the clock signal CLK is made higher in frequency, the delay of the start signal SP2 becomes greater. In the configuration in which the output of the 39th stage preceding the final stage of the bidirectional shift register 14 by one stage is output to the succeeding driver 16 as the output start signal, there arises no problem as far as the frequency of the clock signal CLK is the current average one. When the delay of the start signal SP2 is made longer than one cycle of the clock signal CLK by increasing the frequency of the clock signal CLK, the temporal margin will be lost so that a malfunction may occur. To comply with this, ideally, the output start signal is output to the succeeding driver 16 by using the output Q of a stage which precedes the final stage of the bidirectional shift register 14 by 2 or more stages as described above.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An integrated circuit includes a multistage shift register, from each stage of which an output to be sequentially shifted in synchronization with a clock signal is derived in response to an input start signal, the integrated circuit comprising:

a start signal generating circuit for generating an output start signal in a cycle longer than one cycle of the clock signal in response to an output from a stage preceding a final stage of the multistage shift register, wherein a cascade connection between the integrated circuit and a succeeding integrated circuit is enabled by using the output start signal as an input start signal for the succeeding integrated circuit.

2. The integrated circuit of claim 1, wherein a plurality of integrated circuits cascade-connected to each other can operate as one multistage shift register in accordance with a common clock signal as a whole.

3. The integrated circuit of claim 2, wherein the start signal generating circuit includes a D-flip flop to which an output of a stage preceding by two stages the final stage of the multistage shift register is supplied as a data input and a signal obtained by dividing a frequency of the clock signal by two is supplied as a clock input, and which generates the output start signal as an output.

4. The integrated circuit of claim 2, wherein the start signal generating circuit comprises:

an n frequency division circuit which outputs a signal obtained by dividing a frequency of the clock signal by n, (n being an integer not less than 3); and a D-flip flop to which an output of a stage preceding by n stages the final stage of the multistage shift register is supplied as a data input and an output of the n frequency division circuit is supplied as a clock input, and which generates the output start signal as an output.

5. The integrated circuit of claim 1, further comprising:

a start pulse control circuit which receives the input start signal and controls the input start signal so as to have a pulse width suitable for the operation of the multistage shift register.

6. The integrated circuit of claim 1, wherein the multistage shift register can be switched bidirectionally in shift direction.

7. The integrated circuit of claim 6, wherein a liquid crystal display device is driven by outputs from a plurality of of the multistage shift register.

8. The integrated circuit of claim 1 further comprising:

a frequency division circuit for dividing a frequency of the clock signal and thereby generating a signal of a cycle longer than that of the clock signal; and an initializing circuit for initializing the frequency division circuit, when power is turned on.

9. The integrated circuit of claim 8, wherein when power is turned on, the clock signal is halted during at least a predetermined time period, and wherein the initializing circuit includes an internal oscillating circuit which oscillates in a cycle shorter than the predetermined time period during which the clock signal is halted, and initializes the frequency division circuit in synchronization with an output of the internal oscillating circuit.

10. The integrated circuit of claim 8, wherein the initializing circuit initializes the frequency division circuit through of a power-on reset operation which uses a delay in a rising of a capacitor charging voltage.

11. The integrated circuit of claim 8, wherein the generated signal is of a cycle two times that of the clock signal.

12. The integrated circuit of claim 8, wherein the generated signal is of a cycle three times that of the clock signal.

13. The integrated circuit of claim 1, further comprising:
a frequency division circuit for dividing a frequency of the clock signal and thereby generating a signal of a cycle longer than that of the clock signal.

14. The integrated circuit of claim 1, wherein the start signal generating circuit generates an output signal in response to an output from a stage of the multistage shift register preceding the final stage by one stage.

15. The integrated circuit of claim 1, wherein the start signal generating circuit generates an output signal in response to an output from a stage of the multistage shift register preceding the final stage by two stages.

16. The integrated circuit of claim 1, wherein the start signal generating circuit generates an output signal in response to an output from a stage of the multistage shift register preceding the final stage by three stages.

17. The integrated circuit of claim 1, wherein the start signal generating circuit comprises:
an n frequency division circuit which outputs a signal obtained by dividing a frequency of the clock signal by n, n being an integer not less than 3; and
a D-flip flop to which an output of a stage preceding by n stages the final stage of the multistage shift register is supplied as a data input and an output of the n frequency division circuit is supplied as a clock input, and which generates the output start signal as an output.

18. A display driver, comprising:
a first integrated circuit, including,
a multistage shift register, from each stage of which an output is sequentially shifted in synchronization with a clock signal, and
a start signal generating circuit for generating an output start signal, in a cycle longer than one cycle of the clock signal, in response to an output from a stage preceding a final stage of the multistage shift register, and
a second integrated circuit, connected in cascade to the first integrated circuit, wherein the cascade connection between the first integrated circuit and the second integrated circuit is enabled by using the output start signal as an input start signal for the second integrated circuit.

19. The integrated circuit of claim 18, wherein the multistage shift register can be switched bidirectionally in shift direction.

20. The integrated circuit of claim 18, wherein a liquid crystal display device is driven by outputs from a plurality of stages of the multistage shift register.

21. An integrated circuit comprising:
a multistage shift register, from each stage of which an output to be sequentially shifted in synchronization with a clock signal is derived in response to an input start signal; and start signal generating means for generating an output start signal in a cycle longer than one cycle of the clock signal in response to an output from a stage preceding a final stage of the multistage shift register, wherein a cascade connection between the integrated circuit and a succeeding integrated circuit is enabled by using the output start signal as an input start signal for the succeeding integrated circuit.

22. The integrated circuit of claim 21, wherein a plurality of integrated circuits cascade-connected to each other can operate as one multistage shift register in accordance with a common clock signal as a whole.

23. The integrated circuit of claim 21, wherein the multistage shift register can be switched bidirectionally in shift direction.

24. The integrated circuit of claim 21, further comprising:
a frequency division circuit for dividing a frequency of the clock signal and thereby generating a signal of a cycle longer than that of the clock signal.

25. The integrated circuit of claim 21, wherein a liquid crystal display device is driven by outputs from a plurality of stages of the multistage shift register.

26. A method of cascading a plurality of integrated circuits, each including a multistage shift register from each stage of which a sequentially shiftable output is derived in response to an input start signal, comprising the steps of:
generating an output start signal in a cycle longer than one cycle of the clock signal in response to an output from a stage preceding a final stage of the multistage shift register of a first of the plurality of integrated circuits; and
using the output start signal as an input start signal for the multistage shift register of a second succeeding integrated circuit to thereby enable cascading of the first and second integrated circuits.

27. The method of claim 26, wherein at least one of the multistage shift registers is bidirectional and can be switched in shift direction.

28. The method of claim 26, further comprising the step of:
driving a liquid crystal display device with outputs from a plurality of stages of the multistage shift registers.

29. The method of claim 26, wherein the output start signal is generated in response to an output from a stage of the multistage shift register preceding the final stage by one stages.

30. The method of claim 26, wherein the output start signal is generated in response to an output from a stage of the multistage shift register preceding the final stage by two stages.

31. The method of claim 26, wherein the output start signal is generated in response to an output from a stage of the multistage shift register preceding the final stage by three stages.

* * * * *